(12) United States Patent
Cok et al.

(10) Patent No.: US 11,538,849 B2
(45) Date of Patent: Dec. 27, 2022

(54) MULTI-LED STRUCTURES WITH REDUCED CIRCUITRY

(71) Applicant: X Display Company Technology Limited, Dublin (IE)

(72) Inventors: Ronald S. Cok, Rochester, NY (US); Matthew Alexander Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 121 days.

(21) Appl. No.: 16/886,625

(22) Filed: May 28, 2020

(65) Prior Publication Data
US 2021/0375979 A1  Dec. 2, 2021

(51) Int. Cl.
*H01L 27/15* (2006.01)
*H01L 33/62* (2010.01)
*H01L 25/065* (2006.01)
*H01L 33/36* (2010.01)

(52) U.S. Cl.
CPC .............. *H01L 27/15* (2013.01); *H01L 33/36* (2013.01); *H01L 33/62* (2013.01); *H01L 25/0655* (2013.01); *H01L 2933/0016* (2013.01); *H01L 2933/0066* (2013.01)

(58) Field of Classification Search
CPC ................................................ H01L 33/00–486
See application file for complete search history.

(56) References Cited

U.S. PATENT DOCUMENTS

| | | | |
|---|---|---|---|
| 6,142,358 A | 11/2000 | Cohn et al. | |
| 6,242,761 B1* | 6/2001 | Fujimoto | H01L 33/145 257/618 |
| 6,791,120 B2* | 9/2004 | Toda | H01S 5/32341 257/765 |
| 7,195,733 B2 | 3/2007 | Rogers et al. | |
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,662,545 B2 | 2/2010 | Nuzzo et al. | |
| 7,675,075 B2* | 3/2010 | Nagai | H01L 33/387 257/E33.057 |

(Continued)

OTHER PUBLICATIONS

Bower, C. A. et al., Emissive displays with transfer-printed assemblies of 8 μm x15 μm inorganic light-emitting diodes, Photonics Research, 5(2):A23-A29, (2017).

(Continued)

*Primary Examiner* — Didarul A Mazumder
*Assistant Examiner* — Gustavo G Ramallo
(74) *Attorney, Agent, or Firm* — Choate, Hall & Stewart LLP; Michael D. Schmitt

(57) ABSTRACT

A multi-LED structure comprises a first LED and a separate second LED disposed on a common multi-LED native substrate. The LEDs each comprise a common first layer having a cantilever portion and a base portion and a common second layer having a light-emitting emission portion disposed only over the base portion. An LED electrode electrically connects the first LED to the second LED. The cantilever portion extends in a direction different from the base portion or a length of the cantilever portion is less than a distance between the emission portions of the first and second LEDs.

23 Claims, 29 Drawing Sheets

(56) References Cited

U.S. PATENT DOCUMENTS

| | | |
|---|---|---|
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,062,916 B2 | 11/2011 | Krames et al. |
| 8,333,860 B1 | 12/2012 | Bibl et al. |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,818,725 B2 | 11/2017 | Bower et al. |
| 9,865,832 B2 | 1/2018 | Bibl et al. |
| 9,929,053 B2 | 3/2018 | Bower et al. |
| 10,224,231 B2 | 3/2019 | Bower et al. |
| 10,453,826 B2 | 10/2019 | Raymond et al. |
| 2003/0141570 A1 | 7/2003 | Chen et al. |
| 2005/0253151 A1* | 11/2005 | Sakai ................ H01L 33/62 257/79 |
| 2010/0306993 A1 | 12/2010 | Mayyas et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2016/0093600 A1 | 3/2016 | Bower et al. |
| 2017/0338374 A1 | 11/2017 | Zou et al. |
| 2020/0395510 A1* | 12/2020 | Bower ............... H01L 25/0753 |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

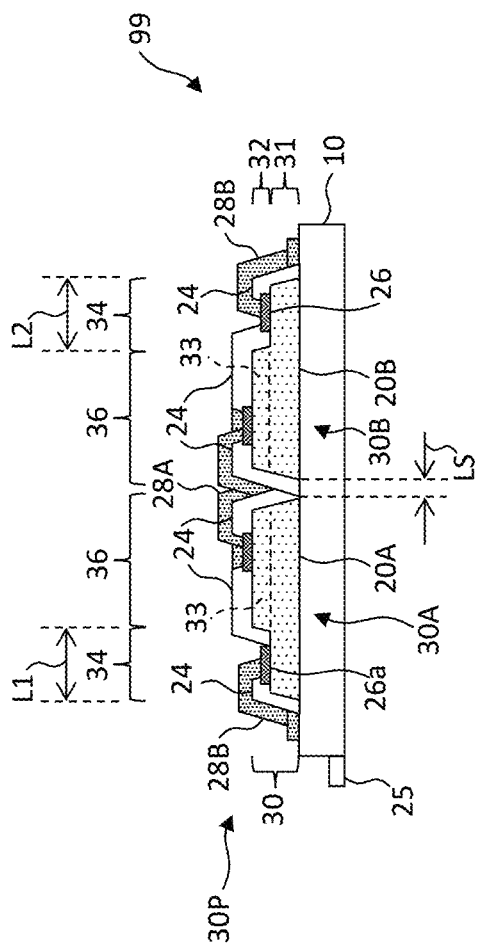
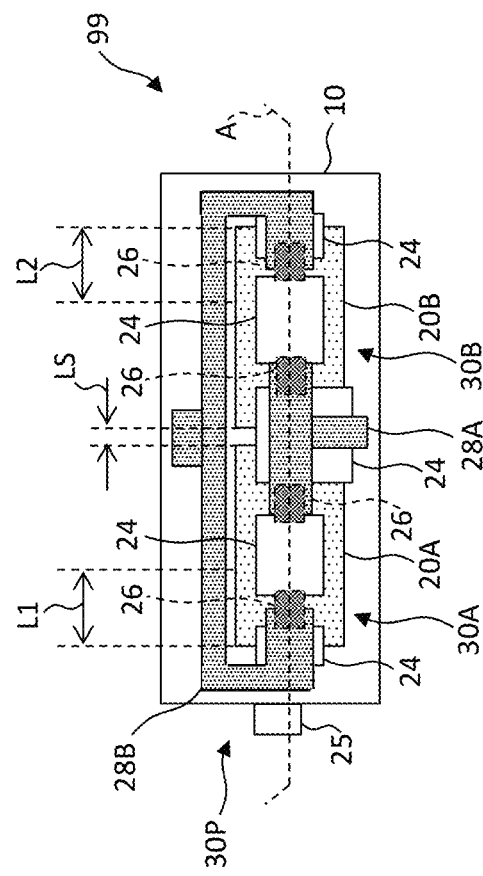

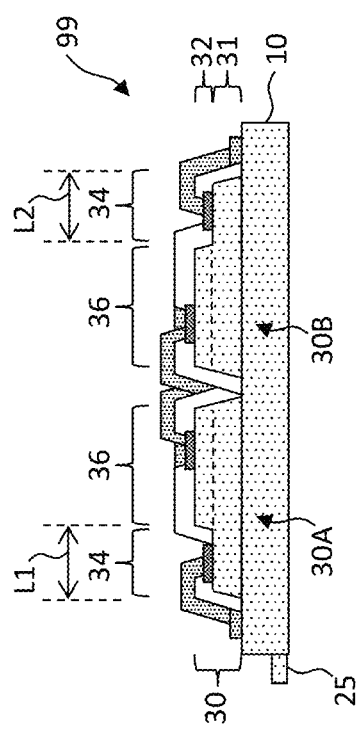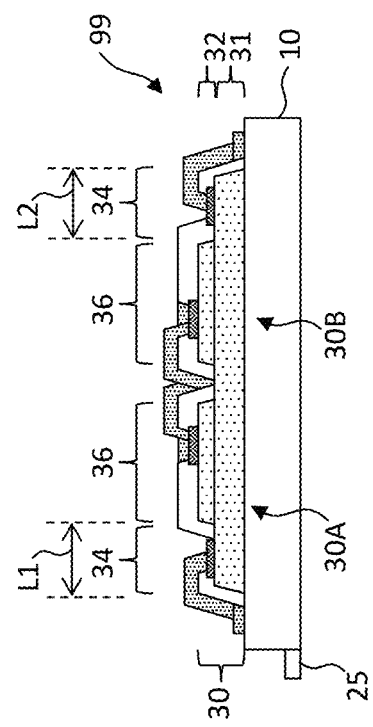

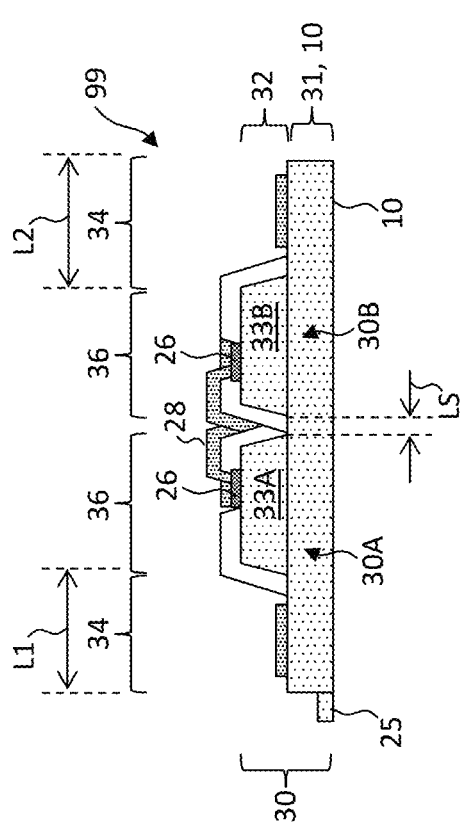

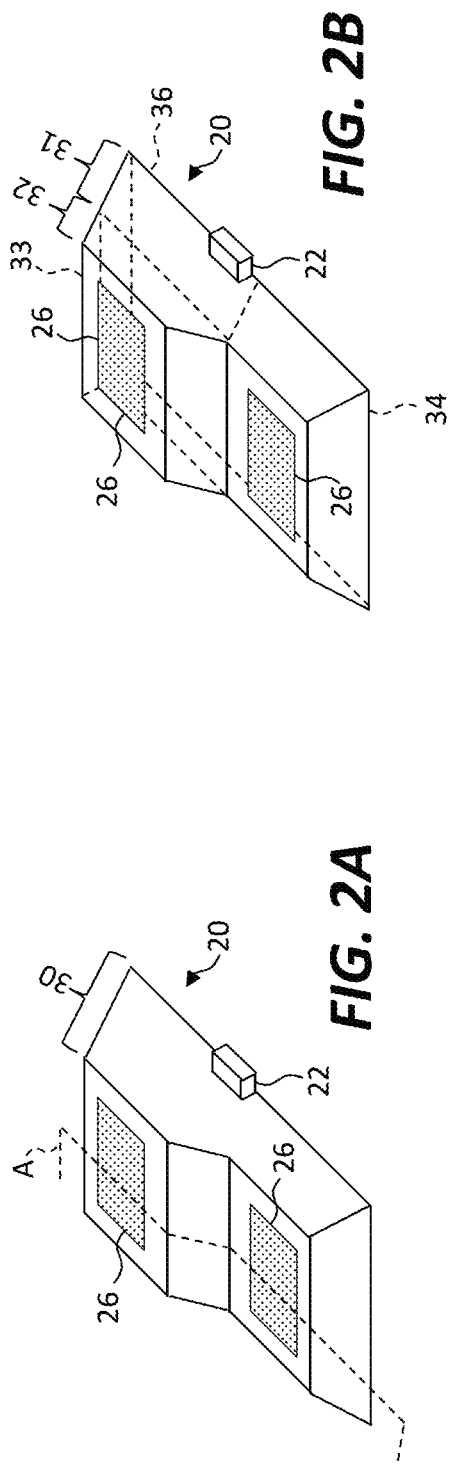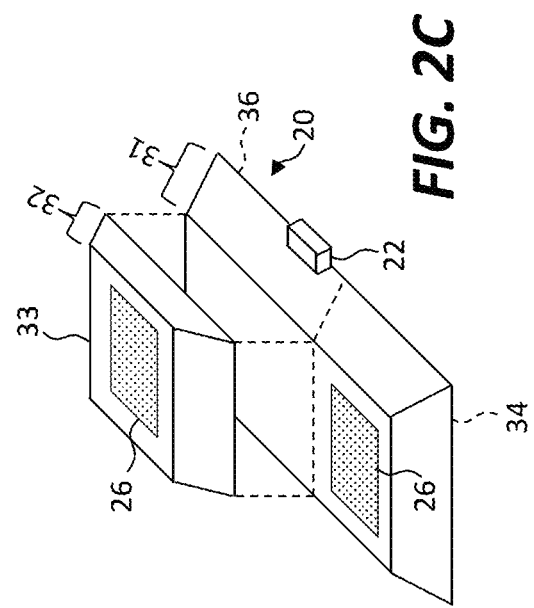

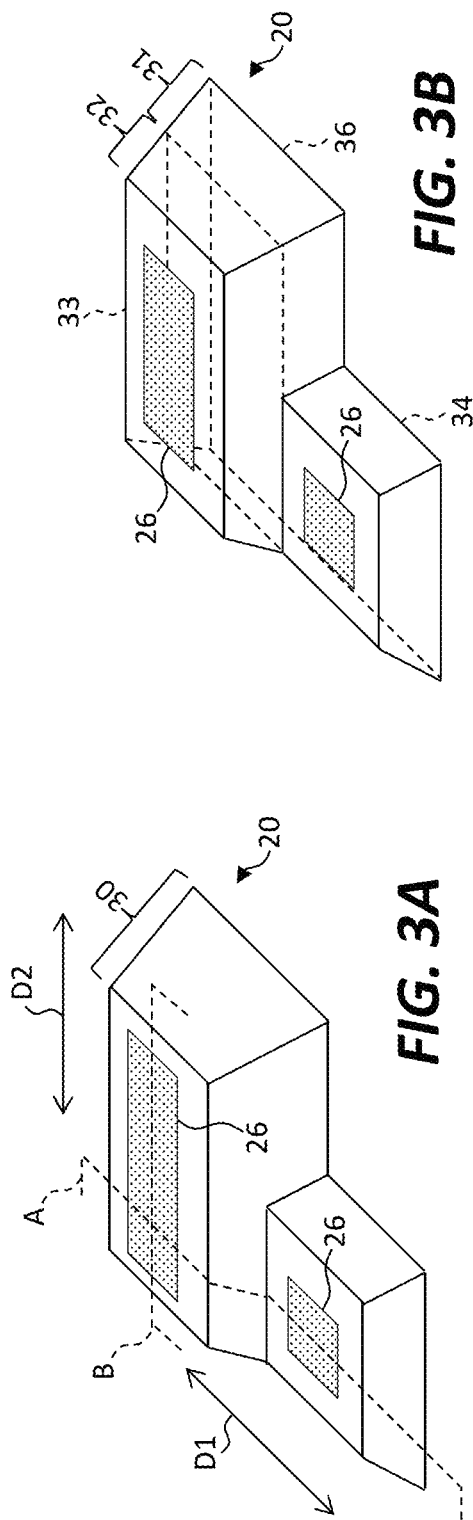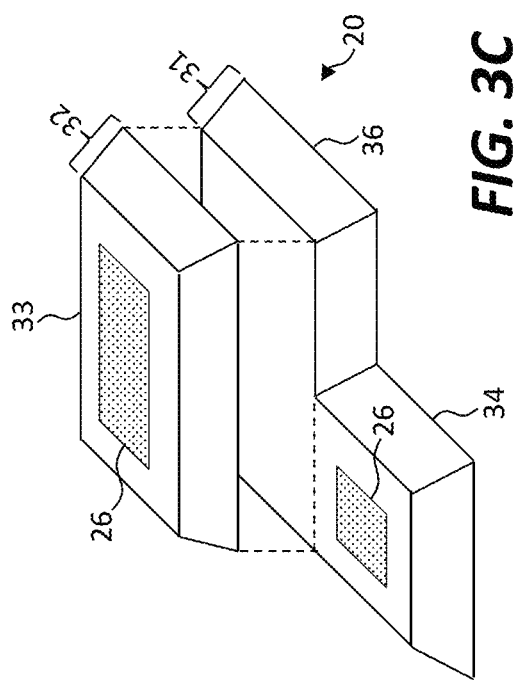

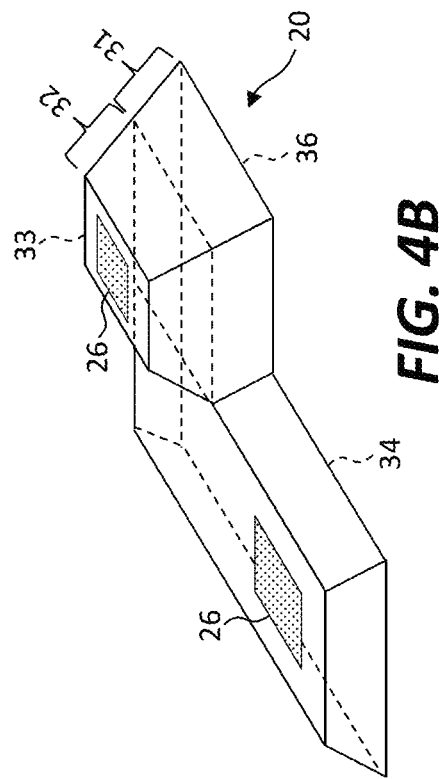
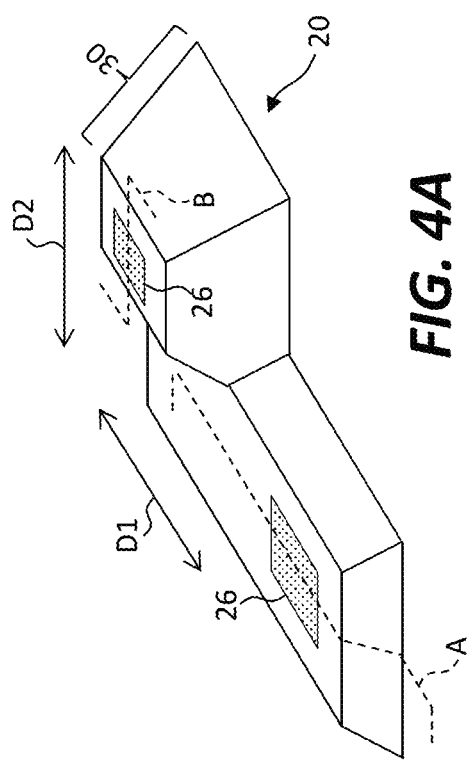
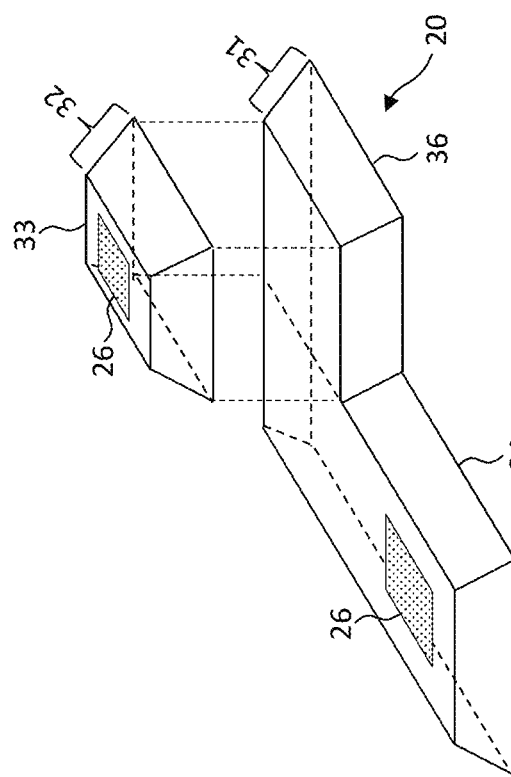
FIG. 4A
FIG. 4B
FIG. 4C

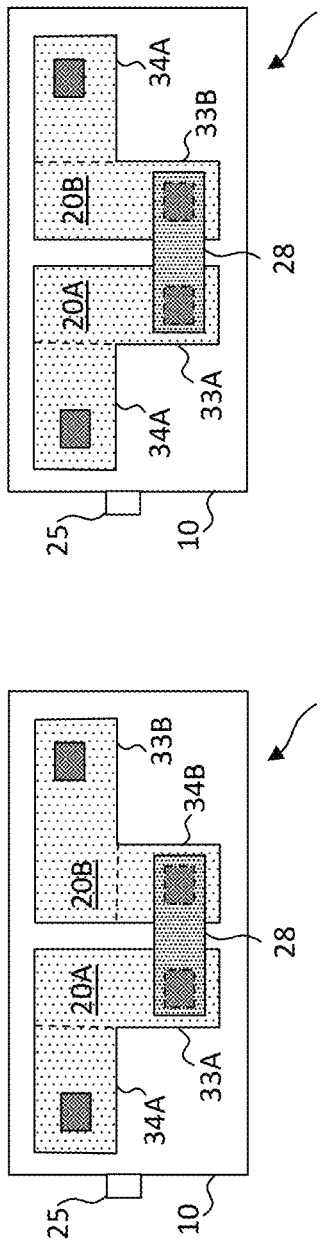
FIG. 20
FIG. 21
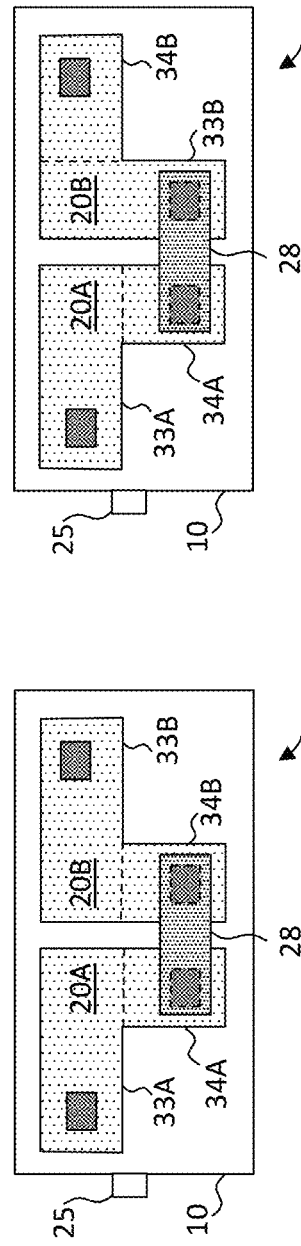
FIG. 22
FIG. 23

US 11,538,849 B2

MULTI-LED STRUCTURES WITH REDUCED CIRCUITRY

CROSS REFERENCE TO RELATED APPLICATION

Reference is made to U.S. patent application Ser. No. 16/778,948, filed Jan. 31, 2020, entitled Micro-LED Color Display with Different Current Densities by Bower et al., the disclosure of which is incorporated herein by reference in its entirety.

TECHNICAL FIELD

The present disclosure relates to micro-light-emitting diode structures for transfer printing.

BACKGROUND

Large-format inorganic light-emitting diode (iLED) displays are used in outdoor and stadium displays. Because the iLEDs are relatively large, for example one square millimeter, they are restricted to relatively low-resolution displays. However, as iLED technology develops, there is increasing interest in applying smaller iLEDs to displays having higher resolution. Full-color displays typically include pixels with three (or more) emitters, usually red, green, and blue emitters, distributed in an array over the display surface. For example, inorganic light-emitting diodes used in flat-panel displays are disclosed in U.S. Pat. No. 9,818,725 entitled Inorganic-Light-Emitter Display with Integrated Black Matrix.

Inorganic light-emitting diodes are semiconductor light sources relying on p-n junctions to emit light when a suitable voltage is applied across the light-emitting diode. The color of the light emitted from the iLED corresponds to the energy bandgap of the semiconductor. Thus, different semiconductor materials can emit different colors of light when stimulated with suitably different voltages. Typical materials include InGaN (emitting blue light), AlGaP (emitting green light), and AlGaAs (emitting red light), among many other materials. Blue-light-emitting materials can emit light at voltages ranging from 2.5-3.7 volts, green-light-emitting materials can emit light at voltages ranging from 1.9-4 volts, and red-light-emitting materials can emit light at voltages ranging from 1.6-2 volts, for example as taught in U.S. Pat. No. 10,453,826, entitled Voltage Balanced Serial ILED Pixel and Display. Moreover, the efficiency with which the different materials emit light can depend on the density of the current passing through the materials.

In order to provide the different voltages and currents needed by the different light-emitting diodes emitting different colors of light in a full-color pixel, a separate power supply can supply power, ground, and control signals to each color light emitter in each multi-color pixel. By supplying the appropriate voltages and currents to each light emitter, the light emitters efficiently emit light. However, providing three (or more) different power, ground, and control signals to each multi-color pixel requires three times as many power supplies, lines, and connections, reducing the available space in the display and increasing costs.

Alternatively, a single power supply can provide power to all three different iLEDs in the full-color pixels. In this case any excess voltage is dropped across other circuit components, increasing heat and reducing overall display system power efficiency.

There is a need, therefore, for an improved pixel and LED structure that improves power efficiency and reduces circuitry, wiring, and assembly costs.

SUMMARY

According to some embodiments of the present disclosure, a multi-LED structure comprises a multi-LED native substrate and a patterned semiconductor layer comprising semiconductor portions disposed on or over the multi-LED native substrate. The multi-LED native substrate can be a single, unitary, and contiguous substrate on which is disposed the semiconductor portions. In some embodiments, the multi-LED native substrate is not divided into separate or distinct portions (e.g., each portion comprising a separate and independent individual semiconductor portion) that can be separately disposed in different locations and is therefore a single, unitary, and contiguous substrate. The semiconductor portions define at least a first LED and a second LED separate from the first LED. The first LED and the second LED each comprise (i) a first layer having a cantilever portion and a base portion, and (ii) a second layer disposed only over the base portion of the first layer and comprising an emission portion. In some embodiments, at least a portion of the first layer is shared between the first LED and the second LED. In some embodiments, at least a portion of the first layer is at least a portion of the multi-LED native substrate. An LED electrode is disposed on at least a portion of the multi-LED native substrate or disposed on at least a portion of a non-semiconductor structure in the semiconductor layer, or both. The LED electrode is also disposed on at least a portion of the first LED and on at least a portion of the second LED so that the LED electrode electrically connects the first LED to the second LED. In some embodiments, the cantilever portion of the first LED extends in a first direction and the base portion of the first LED extends in a second direction different from the first direction. In some embodiments, the cantilever portion of the first LED has a first cantilever length, the cantilever portion of the second LED has a second cantilever length, and an LED emission separation distance between the emission portion of the first LED and the emission portion of the second LED is less than or equal to the first cantilever length and less than or equal to the second cantilever length. In some embodiments, both are true.

The first LED and the second LED can be electrically connected in serial or electrically connected in parallel. The multi-LED structure can comprise more than two semiconductor portions and LEDs that are electrically connected in any combination of series and parallel for any combination of LEDs. For example, the semiconductor portions can define at least a third LED separate from the first LED and separate from the second LED. Separate LEDs have independent emission portions that can be spatially separate or electrically separate in the absence of electrodes. Separate LEDs can share at least a portion of a cantilever portion or can have separate cantilever portions. The first LED and the second LED can have any one or combination of substantially the same size, substantially the same area over the multi-LED substrate, and different size or same size lightemitting areas of the first LED and the second LED.

The multi-LED structure can comprise a tether or a broken or fractured tether. In embodiments, the first and second LEDs do not comprise a tether or portion of a tether. The multi-LED structure can be transfer printed, for example micro-transfer printed. The multi-LED structure can be a bare die without an enclosing package, e.g., a ceramic or plastic package.

According to embodiments of the present disclosure, the multi-LED native substrate has a surface and the first direction of the cantilever portion is orthogonal to the second direction of the base portion and both the first and the second directions are substantially parallel to the surface. According to some embodiments, the cantilever portion extends in a same direction as the base portion. According to some embodiments, the first LED and the second LED extend in substantially a same direction. According to some embodiments, the first LED and the second LED extend in substantially orthogonal directions.

According to embodiments of the present disclosure, the multi-LED structure can comprise a first LED contact disposed on the first LED and a second LED contact disposed on the second LED, the first LED contact and the second LED contact separate from the LED electrode and not electrically connected to the LED electrode. The LED contact separation distance between the first and second LED contacts separate from the LED electrode can be greater than a first LED length of the first LED, greater than a second LED length of the second LED, or greater than the larger of the first LED length and the second LED length. A length of an LED can be the longest dimension of the LED parallel to a surface of the multi-LED native substrate. The separate first and second LED contacts can be electrically connected to an external device through wires separate from the LED electrode. For example, the multi-LED structure can be disposed on a target substrate having target substrate wires that are electrically connected to the separate first and second LED contacts, for example using photolithographic methods and materials.

According to some embodiments of the present disclosure, the multi-LED native substrate has a center, a first edge, and a second edge different from the first edge. In some embodiments, the first LED contact separate from the LED electrode is disposed closer to the first edge than to the center and the second LED contact separate from the LED electrode is disposed closer to the second edge than to the center. In some embodiments, the multi-LED native substrate has a center, a first corner, and a second corner different from the first corner, and the first LED contact separate from the LED electrode is disposed closer to the first corner than to the center and the second LED contact separate from the LED electrode is disposed closer to the second corner than to the center.

According to some embodiments, the multi-LED native substrate is a first multi-LED native substrate and the multi-LED structure comprises a second multi-LED native substrate disposed on the first multi-LED substrate, comprises other LEDs separate and independent of the first and second LEDs disposed on the second multi-LED native substrate, or comprises both. The one or more LEDs (first and second LEDs) disposed on the first multi-LED native substrate and the other LEDs separate and independent of the first and second LEDs disposed on the second multi-LED native substrate comprise a semiconductor material different from a semiconductor material of the semiconductor layer, and can, for example can emit different colors of light than the first and second LEDs can emit.

According to some embodiments, one or more other LEDs separate from the first LED and separate from the second LED are disposed on the first multi-LED native substrate. The one or more LEDs (first and second LEDs) disposed on the first multi-LED native substrate and the other LEDs separate and independent of the first and second LEDs disposed on the first multi-LED native substrate comprise a semiconductor material different from a semiconductor material of the semiconductor layer, and can, for example can emit different colors of light than the first and second LEDs can emit.

According to some embodiments, the multi-LED native substrate comprises at least a portion of the first layer or the first layer comprises at least a portion of the multi-LED native substrate and the multi-LED native substrate is electrically conductive.

According to embodiments of the present disclosure, a multi-LED component structure comprises a component substrate and a first multi-LED structure is disposed on the component substrate. The multi-LED component structure can comprise a second multi-LED structure disposed on the component substrate, can comprise one or more other LEDs disposed on the component substrate, or can comprise both. In some embodiments, the first multi-LED structure and the second multi-LED structure can emit different colors of light. In some embodiments, the first multi-LED structure and the one or more other LEDs emit different colors of light. The first LED and the second LED of the first multi-LED structure can be electrically connected in series and the first LED and second LED of the second multi-LED structure can be electrically connected in parallel. For example, the first multi-LED structure can emit red light and the second multi-LED structure can emit green or blue light.

According to some embodiments, the multi-LED structure comprises a third individual and separate LED separate from the first and second LEDs of the multi-LED structure or a third multi-LED structure disposed on the component substrate and the third LED or third multi-LED structure emits a color of light different from a color of light emitted by the first and second LEDs of the first multi-LED structure and different from a color of light emitted by the one or more other LEDs or second multi-LED structure. According to some embodiments, the multi-LED component structure comprises another LED or second multi-LED structure disposed on the component substrate, a third LED or third multi-LED structure disposed on the component substrate, and a fourth LED or fourth multi-LED structure disposed on the component substrate. The one or more other LEDs or second multi-LED structure, the third LED or third multi-LED structure, and the fourth LED or fourth multi-LED structure can be electrically serially connected. According to some embodiments, the second LED or second multi-LED structure emits a second color of light, the third LED or third multi-LED structure emits a third color of light, and the fourth LED or fourth multi-LED structure emits a fourth color of light and the second, third, and fourth colors of light are all different. The second color of light can be red, the third color of light can be green, and the fourth color of light can be blue.

According to some embodiments, an LED wafer comprises a wafer comprising sacrificial portions separated by anchor portions and a multi-LED structure is disposed entirely and completely over each sacrificial portion and each multi-LED structure is physically connected to an anchor with a tether.

According to some embodiments of the present disclosure, a method of making a multi-LED structure comprises providing a multi-LED native substrate and disposing semiconductor layers on the multi-LED native substrate. The semiconductor layers are patterned to form spatially separated semiconductor portions. The semiconductor portions define at least a first LED and a second LED separate from the first LED. The first LED and the second LED each comprise a first layer having a cantilever portion and a base portion. A patterned second layer is disposed only over the base portion. An LED electrode is disposed on at least a portion of the multi-LED native substrate or on at least a portion of a non-semiconductor structure in the semiconductor layer. The LED electrode is also disposed on at least a portion of the first LED and on at least a portion of the second LED, so that the LED electrode electrically connects the first LED to the second LED. In some embodiments, the cantilever portion of the first LED extends in a first direction and the base portion of the first LED extends in a second direction different from the first direction. In some embodiments, the cantilever portion of the first LED has a first cantilever length, the cantilever portion of the second LED has a second cantilever length, and an LED emission separation distance between the emission portion of the first LED and the emission portion of the second LED is less than or equal to the first cantilever length and less than or equal to the second cantilever length. In some embodiments, both are true.

Methods of the present disclosure comprise providing an LED source wafer comprising sacrificial portions separated by anchor portions. A multi-LED structure is disposed entirely and completely over each sacrificial portion and each multi-LED structure is physically connected to an anchor with a tether. The sacrificial portions are etched to suspend each multi-LED structure over a corresponding sacrificial portion. A stamp and a target substrate are provided, and each multi-LED structure is micro-transfer printed from the multi-LED native substrate to the target substrate with the stamp.

According to an embodiment of the present disclosure, a multi-LED structure comprises an electrically conductive semiconductor layer comprising a cantilever portion and two or more spatially separated base portions, a separate emissive portion comprising a light-emissive semiconductor portion disposed on each base portion, and an LED contact pad disposed on each emissive portion. Each emissive portion emits light when electrical power is provided to the cantilever portion and the LED contact pad.

According to some embodiments of the present disclosure, a multi-LED component structure comprises a component substrate, a first multi-LED native substrate disposed on the component substrate, the first multi-LED native substrate having a first LED and a separate second LED disposed thereon, wherein the first LED and the second LED are native to the first multi-LED native substrate and electrically connected, and a second multi-LED native substrate having a third LED and a separate fourth LED disposed thereon, the third LED and the fourth LED are native to the second multi-LED native substrate and electrically connected, wherein the first LED, the second LED, the third LED, and the fourth LED are electrically connected to a common electrical connection. At least one of (i) the first LED and the second LED can be electrically connected in series and the third LED and the fourth LED can be electrically connected in parallel and (ii) the first LED and the second LED can emit a first color of light and the third LED and the fourth LED can emit a second color of light. The second multi-LED native substrate can be disposed on the first multi-LED native substrate.

According to some embodiments of the present disclosure, a multi-LED component structure further comprises a fifth LED non-native to the component substrate, the first multi-LED native substrate and the second multi-LED native substrate, wherein the fifth LED emits a different color of light from the first LED, the second LED, the third LED, and the fourth LED.

Embodiments of the present disclosure provide a display, lamps, pixels, or light emitters having improved optical characteristics and power efficiency and fewer separate components, control circuits, and electrical connections that can be constructed in fewer manufacturing steps.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a schematic cross section of a multi-LED structure taken across cross section line A of the schematic plan view of FIG. 1B illustrating embodiments of the present disclosure;

FIG. 1C is a schematic cross section of a multi-LED structure wherein a semiconductor layer and a multi-LED native substrate comprise a same material according to illustrative embodiments of the present disclosure;

FIG. 1D is a schematic cross section of a multi-LED structure wherein a first layer is common to multiple LEDs according to illustrative embodiments of the present disclosure;

FIG. 1E is a schematic cross section of a multi-LED structure wherein a first layer and a multi-LED native substrate are a common layer according to illustrative embodiments of the present disclosure;

FIG. 3A is a schematic perspective of an LED indicating cross-section line A also corresponding to the cross section of FIG. 2D, FIG. 3B is a schematic perspective indicating layers of the LED, and FIG. 3C is an exploded schematic perspective of the LED according to illustrative embodiments of the present disclosure;

FIG. 4A is a schematic perspective of an LED, FIG. 4B is a schematic perspective indicating layers of the LED, and FIG. 4C is an exploded schematic perspective of the LED according to illustrative embodiments of the present disclosure;

FIGS. 5-23 are schematic plan views illustrating electrical connections within multi-LED structures according to illustrative embodiments of the present disclosure;

Figure 2D:
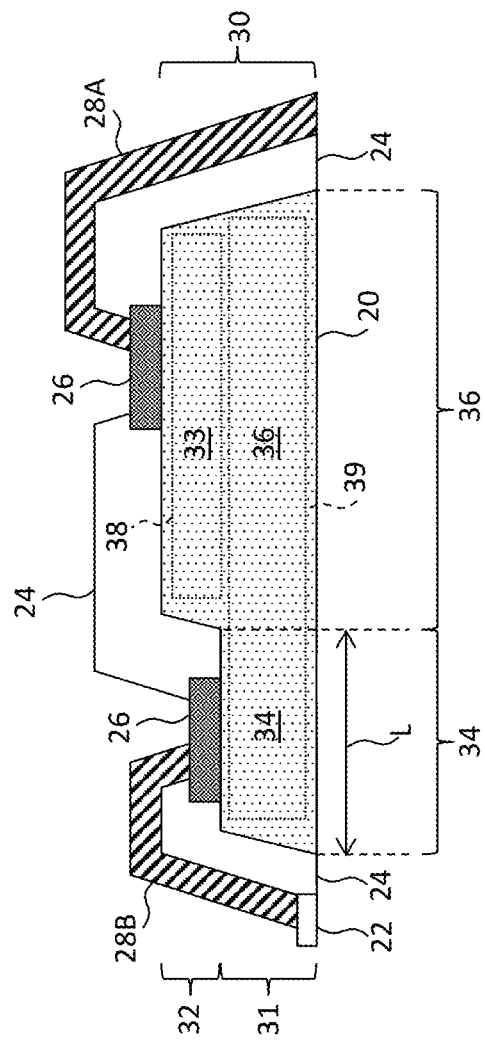
FIG. 2A is a schematic perspective of an LED indicating cross-section line A of the cross section of FIG. 2D.
FIG. 2B is a schematic perspective indicating layers of the LED.
FIG. 2C is an exploded schematic perspective of the LED according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide electrically connected iLEDs formed at the same time with common materials in a single process, e.g., a photolithographic process. The iLEDs can have one or more of a reduced area and structure size, improved manufacturing efficiency, improved operating efficiency, and simplified power and control circuitry when incorporated in a display or in other multi-color light output devices such as lamps, or as individual structures in an optical indicator. In some embodiments, a power supply for differently colored light emitters in an illumination device or display pixel can comprise a single current supply and a single voltage supply rather than multiple current and voltage supplies.

According to some embodiments of the present disclosure and as illustrated in the cross section of FIG. 1A taken along cross section line A of the corresponding plan view of FIG. 1B and FIG. 1C, a multi-LED structure 99 comprises a multi-LED native substrate 10 and a patterned semiconductor layer 30 comprising spatially separated semiconductor portions 30P (e.g., first semiconductor portion 30A and second semiconductor portion 30B) disposed on or over multi-LED native substrate 10. A multi-LED native substrate 10 can be a single, unitary, and contiguous substrate. Semiconductor layer 30 is formed (e.g., photolithographically patterned) on multi-LED native substrate 10 making first semiconductor portion 30A and second semiconductor portion 30B native to multi-LED native substrate. First semiconductor portion 30A and second semiconductor portion 30B, both native to multi-LED native substrate 10, can be defined in common steps using common materials and tools. In some embodiments, multi-LED native substrate 10 is not divided into separate or distinct portions (e.g., each portion comprising a separate semiconductor portion such as first semiconductor portion 30A or second semiconductor portion 30B) that can be separately disposed in different locations, and is therefore a single, unitary, and contiguous substrate. Multi-LED native substrate 10 can comprise any suitable material on which semiconductor layer 30 can be formed and can include a seed layer. In some embodiments, semiconductor layer 30 comprises a seed layer. For example, multi-LED native substrate 10 can comprise a sapphire, silicon, silicon carbide, or compound semiconductor wafer, such as those found in the integrated circuit, flat-panel display, or opto-electronic arts. Multi-LED native substrate 10 can comprise an undoped semiconductor, for example undoped silicon, or an ion-doped semiconductor that is resistive to the flow of electrical current, e.g., as shown in FIG. 1C with semiconductor structures shown with common shading. First and second semiconductor portions 30A, 30B (and any other semiconductor portions 30P) are collectively referred to as semiconductor portions 30P.

Semiconductor layer 30 and semiconductor portions 30P can be constructed by depositing epitaxial layers of semiconductor materials, for example doped or undoped semiconductor materials such as Si or compound semiconductor materials such as GaN, GaAs, $In_xGa_{1-x}N$, $Al_xGa_{1-x}P$, and $Al_xGa_{1-x}As$, or other semiconductor or compound semiconductor materials and alloys, for example with p or n doping, and, in some embodiments, then pattern-wise etched to form separate semiconductor portions 30P. Semiconductor layer 30 can comprise mono-crystalline semiconductor materials and can be deposited, together with any suitable dopants, for example by sputtering, evaporative, or vapor deposition methods and processed using photolithographic methods and materials, for example using patterned photoresist masking and etching techniques. Semiconductor layer 30 can include sublayers (e.g., first layer 31 and second layer 32) and first and second layers 31, 32 can be patterned and can also include sub-layers, for example with different material compositions or doping or both.

Semiconductor portions 30P (e.g., first semiconductor portion 30A and second semiconductor portion 30B) can define at least a first LED 20A and a second LED 20B spatially separate from first LED 20A on multi-LED native substrate 10. First and second LEDs 20A and 20B are referred to collectively as LEDs 20. First LED 20A and second LED 20B can each comprise (i) a first layer 31 having a cantilever portion 34 and a base portion 36, and (ii) a second layer 32 disposed only over base portion 36 of first layer 31 comprising an emission portion 33 that emits light and is a light-emitting portion. Spatially separate LEDs 20 have separate emission portions 33 (and base portions 36) and can be independently operable with suitable electrical connections. First and second layers 31, 32 can be semiconductor layers with or without doping or sub-layers. First layer 31 can be separate for both first and second LEDs 20A, 20B or, in some embodiments, first layer 31 is common (for example at least partially common) to both first and second LEDs 20A, 20B, e.g., as shown in FIGS. 1D and 1E. First layer 31 can be common, for example at least partially common, with multi-LED native substrate 10, e.g., as shown in FIG. 1E.

Referring to FIG. 1C, in some embodiments, multi-LED native substrate 10 and first layer 31 are the same, or at least partially the same, layer, and cantilever portion 34 is a raised portion of multi-LED native substrate 10 that extends beyond emission portion 33. First layer 31 comprising cantilever portion 34 and base portion 36 is an electrically conductive layer and does not emit light. First layer 31 conducts electrical current to second layer 32 which emits light from emissive portion 33 in response to the electrical current. LED contact pads 26, for example comprising a photolithographically patterned evaporatively deposited metal such as aluminum, a transparent conductive oxide, or a doped semiconductor, can be disposed on emission portion 33 and cantilever portion 34 of first and second LEDs 20A, 20B to provide electrical contacts to first and second LEDs 20A, 20B. Electrical power (e.g., electrical current at a suitable voltage) can be provided to first and second LEDs 20A, 20B so that first and second LEDs 20A, 20B emit light. LEDs 20 can be horizontal LEDs 20 and can be either top-emitting LEDs 20 that emit light away from multi-LED native substrate 10 or bottom-emitting LEDs 20 that emit light through multi-LED native substrate 10.

Multi-LED native substrate 10 can be electrically conductive and electrically connect first and second semiconductor portions 30A, 30B, for example such that sufficient electrical current can flow to provide a desired amount of light output from emission portions 33. In some embodiments, for example as shown in FIG. 1D, first layer 31 can be at least partially common to both first and second LEDs 20A, 20. In some such embodiments, cantilever portions 34 can be at least partially common to both first and second LEDs 20A, 20 but base portions 36 and emission portions 33 are separate. In some embodiments, for example as shown in FIG. 1E, multi-LED native substrate 10 is at least a portion of first layer 30 or is first layer 30 or first layer 30 comprises at least a portion of multi-LED native substrate 10. In the illustrative embodiment of FIG. 1E, first and second LEDs 20A, 20B can have a common first layer 31. In some such configurations, first LED 20A separate from second LED 20B means that emission portions 33 of each of first LED 20A and second LED 20B are spatially separate, separately controllable, and with a common electrical connection through first layer 31.

As shown in FIG. 1E, a multi-LED structure 99 comprises an electrically conductive semiconductor layer (first layer 31, multi-LED native substrate 10) comprising a cantilever portion 34 and two or more spatially separated base portions 36. A separate emissive portion 33 comprises a light-emissive semiconductor portion disposed on each base portion 36. An LED contact pad 26 is disposed on each emissive portion 33. Each emissive portion 33 emits light when electrical power is provided to cantilever portion 34 and LED contact pad 26. In some embodiments, LED electrode 38 electrically connects each LED contact pad 26 so that emissive portions 33 are electrically connected in parallel.

Patterned dielectric layers 24 or dielectric structures (e.g., comprising silicon dioxide or silicon nitride deposited by sputtering or vapor deposition and photolithographically patterned) can electrically insulate and environmentally protect portions of first and second LEDs 20A, 20B. First and second LED electrodes 28A, 28B, for example comprising reflective patterned metal traces such as aluminum for a bottom-emitter LED 20 or transparent conductive oxides for a top-emitter LED 20 (collectively LED electrodes 28), can be pattern-wise disposed by sputtering or vapor deposition over patterned dielectric layers 24 in electrical contact with LED contact pads 26 to conduct electrical current to first and second LEDs 20A, 20B through LED contact pads 26. FIGS. 1A and 1B illustrate two semiconductor portions 30P (defining first and second LEDs 20A and 20B) but embodiments of the present disclosure are not limited to only two semiconductor portions 30P and LEDs 20. In some embodiments of the present disclosure and as illustrated further below, semiconductor layer 30 can comprise three, four, five, six, seven, eight, nine, ten, or more semiconductor portions 30P defining corresponding LEDs 20. Different LEDs 20 can have different sizes or shapes and, optionally, be electrically connected with different sizes, shapes, or arrangements of contact pads 26.

According to some embodiments of the present disclosure, multi-LED structures 99 have at least one of a width and a length that is no greater than 500 microns (e.g., no greater than 200 microns, no greater than 100 microns, no greater than 50 microns, no greater than 25 microns, no greater than 15 microns, no greater than 12 microns, no greater than 8 microns, or no greater than 5 microns). Different multi-LED structures 99 can have different sizes. Multi-LED structures 99 provide an advantage according to embodiments of the present disclosure since they are sufficiently small and can be disposed spatially close together so that different multi-LED structures 99 in a pixel 60 and sub-pixel cannot be readily distinguished by the human visual system in a display or lamp at a desired viewing distance, improving color mixing of light emitted by a pixel 60 and sub-pixel and providing apparent improvements in resolution and a reduction of pixelization. Multi-LED structures 99 can also assemble multiple LEDs 20 in fewer manufacturing steps and can require fewer LED packages. Multi-LED structures 99 can be unpackaged (e.g., bare) die.

The perspectives of FIGS. 2A-2C and the corresponding cross section of FIG. 2D illustrate the detailed structure of an individual LED 20 (e.g., first LED 20A or second LED 20B). As shown, LED 20 comprises a semiconductor layer 30 comprising first layer 31 and second layer 32. Semiconductor layer 30 can comprise a seed layer on which epitaxial semiconductor material is disposed, e.g., by vapor deposition. First layer 31 has a cantilever portion 34 and an adjacent base portion 36. Patterned second layer 32 has an emission portion 33 disposed on base portion 36 of first layer 31. First layer 31 is electrically conductive and second layer 32 is both conductive and light-emissive. LED contact pads 26 are disposed on each of cantilever portion 34 and emission portion 33. FIG. 2D shows a conduction zone 39 of first layer 31 that conducts electrical current to a recombination zone 38 of emission portion 33 of second layer 32. Electrons and holes conducted by LED contact pads 26 through conduction zone 39 of conductive first layer 31 and through emission portion 33 combine in recombination zone 38 to emit light having a frequency and color corresponding to a bandgap of the semiconductor material comprising recombination zone 38 and emission portion 33.

FIGS. 1A-1C illustrate LED structure tethers 25 related to micro-transfer printing multi-LED structures 99, as discussed further below, for example comprising a portion of multi-LED native substrate 10, a dielectric material such as silicon dioxide or silicon nitride, or an organic material such as a photolithographically deposited and patterned photoresist. FIGS. 2A-2D illustrate similarly constructed LED tethers 22. However, LED tethers 22 are found on individual LEDs 20, not in multi-LED structures 99 as discussed further below and are distinct structures from LED structure tethers 25. LEDs 20 with LED tethers 22 can be individually micro-transfer printed, unlike first and second LEDs 20A, 20B. LEDs 20 (e.g., first LED 20A and second LED 20B) included in multi-LED structures 99 do not include individual LED tethers 22, since first LED 20A and second LED 20B are constructed together in a common process on multi-LED native substrate 10, that is are native to multi-LED native substrate 10. Multi-LED native substrate 10 can have an LED structure tether 25 that enables the entire multi-LED native substrate 10 together with first LED 20A and second LED 20B to be micro-transfer printed from a source wafer as a complete unit. (LED tether 22 of FIG. 2D is shown for illustration and is not properly part of cross section line A of FIG. 2A.) Printed LEDs 20 that include LED tethers 22 can be used in combination with a multi-LED structure 99, for example that includes an LED structure tether 25, as discussed further below.

As shown in FIGS. 1A and 1B, first LED electrode 28A is disposed on at least a portion of multi-LED native substrate 10 or disposed on a non-semiconductor structure in semiconductor layer 30 (e.g., a portion of patterned dielectric layer 24) and is disposed on at least a portion of first LED 20A and on at least a portion of second LED 20B to electrically connect first LED 20A to second LED 20B on multi-LED native substrate 10. As shown in FIG. 1A, first LED electrode 28A is disposed on patterned dielectric layer 24 in semiconductor layer 30 and second LED electrode 28B is disposed directly on multi-LED native substrate 10 and patterned dielectric layer 24 in semiconductor layer 30. Electrodes 28 can comprise a metal such as aluminum or a transparent conductive oxide and can be made using relatively fine high-resolution lithography methods and materials practiced in the photolithographic arts. First and second LED electrodes 28A and 28B can conduct electrical current to external electrical contacts to provide electrical power to multi-LED structure 99. According to some embodiments of the present disclosure, external electrical connections to LED electrodes 28 or LED contact pads 26 are constructed using relative coarse, low-resolution, and less expensive methods and materials, for example found in the printed circuit board arts, thereby reducing the costs of using multi-LED structures 99 (as compared to using high-resolution photolithographic processing for all connections).

In some embodiments of the present disclosure and as illustrated in FIGS. 1A and 1B, cantilever portion 34 of first LED 20A has a first cantilever length L1, cantilever portion 34 of second LED 20B has a second cantilever length L2, and an LED emission separation distance LS between emission portion 33 of first LED 20A and emission portion 33 of second LED 20B is less than or equal to one or more of first cantilever length L1 and second cantilever length L2. According to some embodiments, an LED emission separation distance LS between emission portions 33 of two LEDs 20 is the smallest distance between emission portions 33 of first and second LEDs 20A, 20B parallel to a surface of multi-LED native substrate 10. According to some embodiments, first LED 20A and second LED 20B can extend in substantially a same direction, for example in substantially parallel directions, but are not collinear (a center line of first and second LEDs 20A, 20B are not in a common line). In some embodiments, first LED 20A and second LED 20B extend in substantially a same direction and are collinear having collinear center lines (e.g., within manufacturing tolerances). An LED 20 extending in a direction can refer to the direction of a longest dimension of the LED 20 parallel to multi-LED native substrate 10, as shown with cross section line A of FIG. 2A. In some embodiments, a cantilever portion 34 extending in a direction refers to the direction of a longest dimension of cantilever portion 34 parallel to multi-LED native substrate 10, as shown with cross section line A of FIG. 4A. In some embodiments, a cantilever portion 34 extending in a direction refers to the direction of a cantilever portion midline from an LED contact pad 26 disposed on cantilever portion 34 towards base portion 36 parallel to multi-LED native substrate 10, as shown with cross section line A of FIG. 3A. In some embodiments, a base portion 36 or emission portion 33 extending in a direction refers to the direction of a longest dimension of base portion 36 or emission portion 33 parallel to multi-LED native substrate 10, as shown with cross section line B of FIG. 3A. In some embodiments, a base portion 36 or emission portion 33 extending in a direction refers to the direction of a base portion midline (centerline) from an LED contact pad 26 disposed on emission portion 33 towards cantilever portion 34 parallel to multi-LED native substrate 10, as shown with cross section line B of FIG. 4A. According to some embodiments, first LED 20A and second LED 20B can extend in different directions, for example in substantially orthogonal directions. Similarly, according to some embodiments, cantilever portion 34 and emission portion 33 (and base portion 36) can extend in different directions, for example in substantially orthogonal directions. Substantially can mean within the tolerances of a design or manufacturing process or within 10 degrees, for example with reference to parallel structures or elements.

As shown in FIGS. 3A-4C, in some embodiments of the present disclosure cantilever portion 34 of first LED 20A extends in a first direction D1 and base portion 36 of first LED 20A extends in a second direction D2 different from first direction D1. In some embodiments of the present disclosure, cantilever portion 34 of second LED 20B extends in a first direction D1 and base portion 36 of second LED 20B extends in a second direction D2 different from first direction D1. Referring to the perspectives of FIGS. 3A-3C, emission portion 33 of second layer 32 of semiconductor layer 30 is disposed on base portion 36 of first layer 31 of semiconductor layer 30. Emission portion 33 extends as far as possible in second direction D2 over base portion 36 of first layer 31. Referring to the perspectives of FIGS. 4A-4C, emission portion 33 of second layer 32 of semiconductor layer 30 is likewise disposed on base portion 36 of first layer 31 of semiconductor layer 30 but extends only as far as cantilever portion 34 in second direction D2 over first layer 31. LEDs 20 can incorporate either or both of the structures of FIGS. 3A-3C and FIGS. 4A-4C according to various embodiments of the present disclosure.

In some embodiments of the present disclosure, and as illustrated in FIGS. 3A and 4C, cantilever portion 34 of first LED 20A extends in a first direction D1 and base portion 36 of first LED 20A extends in a second direction D2 different from first direction D1. Similarly, in some embodiments, cantilever portion 34 of second LED 20B extends in a first direction D1 and base portion 36 of second LED 20B extends in a second direction D2 different from first direction D1. Cantilever and base portions 34, 36 that extend in different directions can enable LEDs 20 disposed in close proximity with reduced area over multi-LED native substrate 10. In some embodiments, cantilever portion 34 extends in a different direction from base portion 36 and an LED emission separation distance LS between emission portions 33 of first and second LEDs 20A and 20B can be less than one or more of first cantilever length L1 and second cantilever length L2. According to some embodiments, first and second directions D1 and D2 can be orthogonal, as shown in FIGS. 3A-4C, and parallel to a surface of multi-LED native substrate 10.

By disposing emission portions 33 of first LED 20A and second LED 20B in close proximity, emission portions 33 can appear as a single emitting area to a viewer of multi-LED structures 99 of the present disclosure at a desired viewing distance, thereby reducing the apparent pixelization of multi-LED structures 99, for example used in displays or for lighting. Such small LED emission separation distances LS in multi-LED structures 99 can also improve color mixing for applications in which a multi-color emitter or white light is desired. Furthermore, such close-proximity emission portion 33 arrangements for multiple LEDs 20 can enable small light-emitting structures useful in display and illumination, improving the resolution of the displays and lamps, and can facilitate high-density micro-transfer printing with fewer print steps from a multi-LED structure 99 native source wafer 40 since two (or more) LEDs 20 can be transferred in a single step, rather than requiring two (or more) transfer steps, one for each LED 20.

According to some embodiments of the present disclosure, first LED 20A and second LED 20B of multi-LED structure 99 can be substantially (e.g., within 5%) the same size, can cover substantially (e.g., within 5%) a same-size area over multi-LED native substrate 10, can have substantially (e.g., within 5%) the same light-emitting area of emission portion 33, or any combination of these. In some embodiments, first LED 20A and second LED 20B of multi-LED structure 99 can be different sizes, can cover different-size areas over multi-LED native substrate 10, can have different light-emitting areas of emission portion 33, or any combination of these. Size can be defined by any combination of length, width, or height over multi-LED native substrate 10 and area can be defined by any combination of length or width over multi-LED native substrate 10.

LEDs 20 of multi-LED structure 99 of the present disclosure can be electrically connected in serial or in parallel, or in a combination of serial and parallel connections. Referring to the plan view and electrical schematic of FIG. 5, first LED 20A is electrically connected in parallel with second LED 20B. LED contact pad 26 of cantilever portion 34 of first LED 20A is electrically connected to LED contact pad 26 of cantilever portion 34 of second LED 20B with first LED electrode 28A and LED contact pad 26 of emission portion 33 of first LED 20A is electrically connected to LED contact pad 26 of emission portion 33 of second LED 20B with second LED electrode 28B. Both first and second LED electrodes 28A and 28B are partially disposed on a portion of multi-LED native substrate 10 or non-semiconductor structure (e.g., patterned dielectric layer 24 as shown in FIG. 1A) between first and second LEDs 20A, 20B. First and second electrodes 28A and 28B can be contacted by external power sources, for example through electrodes connected to first and second electrodes 28A, 28B. Emission portions 33 of first and second LEDs 20A, 20B are separated by an LED emission separation distance LS less than a cantilever length L. A third LED 20, or more LEDs 20, can be similarly arranged on multi-LED native substrate 10 on a side of second LED 20B opposite first LED 20A and electrically connected in parallel with first and second LEDs 20A, 20B using first and second electrodes 28A, 28B. LED structure tether 25 can be physically connected to LED substrate 10 to enable, or as a consequence of, micro-transfer printing multi-LED structure 99.

FIGS. 1D and 1E illustrate embodiments in which first and second LEDs 20A, 20B are electrically connected in parallel. In some such configurations, a separate electrode to electrically connect cantilever portions 34 is not necessary, since first and second LEDs 20A, 20B share at least a portion of common first layer 31 that provides a common electrical connection to emission portions 33 of first and second LEDs 20A, 20B. Thus, the physical structure illustrated in FIGS. 1D, 1E can provide the electrical connections illustrated in FIG. 5.

Figure 6:
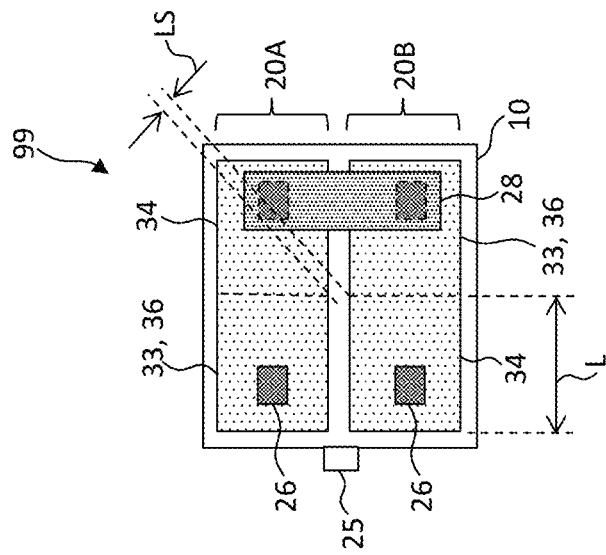

Referring to the plan view and electrical schematic of FIG. 6, first LED 20A is electrically connected in serial with second LED 20B. LED contact pad 26 of cantilever portion 34 of first LED 20A is electrically connected to LED contact pad 26 of emission portion 33 of second LED 20B with LED electrode 28. LED contact pad 26 of cantilever portion 34 of second LED 20B and LED contact pad 26 of emission portion 33 of first LED 20A can be contacted by external power sources, for example through electrodes connected to them. LED electrode 28 is partially disposed on a portion of multi-LED native substrate 10 or a non-semiconductor structure in semiconductor layer 30 between first and second LEDs 20A, 20B. Emission portions 33 of first and second LEDs 20A, 20B are separated by an LED emission separation distance LS less than a cantilever length L. A third LED 20, or more LEDs 20, can be similarly arranged on multi-LED native substrate 10 in alternating orientations on a side of second LED 20B opposite first LED 20A and electrically connected in serial with first and second LEDs 20A, 20B using additional LED electrodes 28.

Figure 7A:
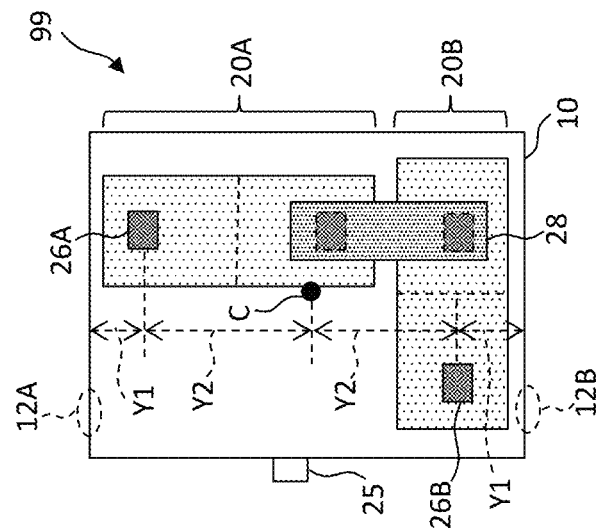
Figure 7B:
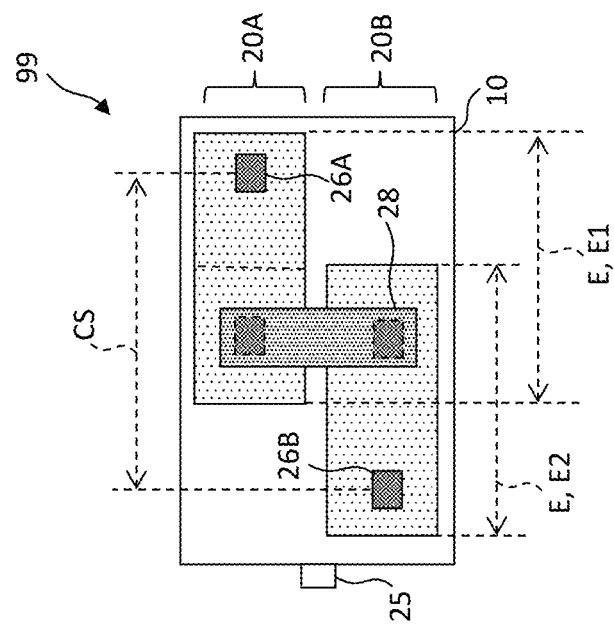
Figure 7D:
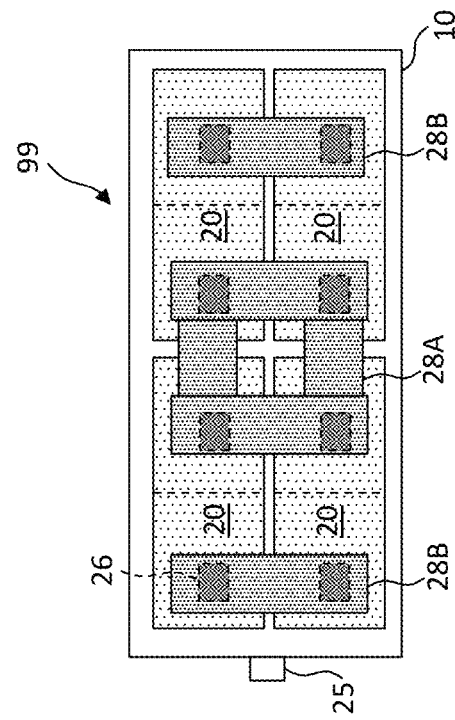
Figure 7C:
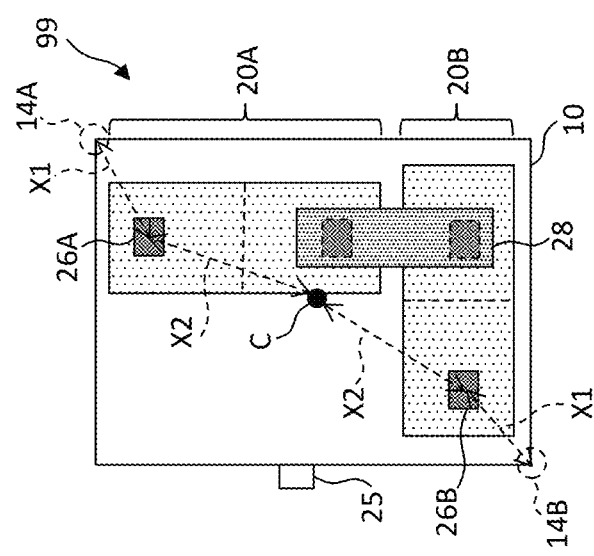

FIGS. 7A-7C illustrate other spatial arrangements of first LED 20A with respect to second LED 20B on multi-LED native substrate 10. In these arrangements, LED contact pads 26 that are not contacted by LED electrode 28 are farther apart so that they can be connected with coarser, lower-resolution electrodes than LED electrode 28, reducing the cost of using multi-LED structures 99 in electronic or electro-optical systems. For example, multi-LED structures 99 can be constructed using high-resolution photolithographic methods and materials found in the integrated circuit or display arts and can be applied or used in lower-cost electronic or optical systems such as printed circuit boards constructed using lower cost methods and materials, for example found in the printed circuit art.

For example, and as shown in FIG. 7A, multi-LED structures 99 can comprise a first LED contact pad 26A disposed on first LED 20A and a second LED contact pad 26B disposed on second LED 20B. First LED contact pad 26A and second LED contact pad 26B are separate from LED electrode 28, that is LED electrode 28 is not electrically connected to first and second LED contact pads 26A, 26B and is therefore an open LED contact pad 26. An LED contact separation distance CS is the distance between the centers of LED contact pads 26 in a direction parallel to a surface of multi-LED native substrate 10 and an LED length E is the longest dimension of LED 20 parallel to a surface of multi-LED native substrate 10. According to some embodiments of the present disclosure, LED contact separation distance CS between first LED contact pad 26A and second LED contact pad 26B is greater than (i) a first LED length E1 of first LED 20A, (ii) a second LED length E2 of second LED 20B, or (iii) the larger of first LED length E1 and second LED length E2. Because LED contact separation distance CS is greater than a length of an LED 20 or LED separation length LS, a lower-resolution and less-expensive process can be used to construct electrical connections (wires or traces) to LED contact pads 26 (e.g., first and second LED contact pads 26A, 26B).

According to some embodiments of the present disclosure, and as illustrated in FIG. 7B, multi-LED native substrate 10 has an LED center C, a first LED substrate edge 12A, and a second LED substrate edge 12B different from first LED substrate edge 12A. First LED contact pad 26A is disposed a first distance Y1 closer to first LED substrate edge 12A than to center C a second distance Y2. Second LED contact pad 26B is disposed a first distance Y1 closer to second LED substrate edge 12B than to center C a second distance Y2. First LED substrate edge 12A and second LED substrate edge 12B can be on opposite edges of multi-LED native substrate 10, where multi-LED native substrate 10 has a quadrilateral surface, for example a rectangle.

According to some embodiments of the present disclosure and as shown in FIG. 7C, multi-LED native substrate 10 has an LED center C, a first LED substrate corner 14A and a second LED substrate corner 14B different from first LED substrate corner 14A. First LED contact pad 26A is disposed closer to first LED substrate corner 14A a first distance X1 than to center C a second distance X2 and second LED contact pad 26B is disposed closer to second LED substrate corner 14B a first distance X1 than to center C a second distance X2. First LED substrate corner 14A and second LED substrate corner 14B can be on opposite corners of multi-LED native substrate 10, where multi-LED native substrate 10 is a quadrilateral, for example a rectangle. Because LED contact pads 26 are disposed closer to first or second LED substrate edges 12A, 12B or first or second LED substrate corners 14A, 14B than to LED centers C of multi-LED native substrate 10, a lower-resolution and less expensive process can be used to construct electrical connections (wires or traces) to LED contact pads 26.

FIG. 7D shows an illustrative multi-LED structure 99 arrangement having four LEDs 20 electrically connected in parallel (omitting a portion of second LED electrode 28B). Any of LED 20 arrangements of FIGS. 5-7C or those of FIGS. 8-23 can be extended to more than two LEDs 20 and can be electrically connected in series, in parallel, or in combinations of series and parallel, as discussed with respect to FIGS. 27-30.

Figure 5:
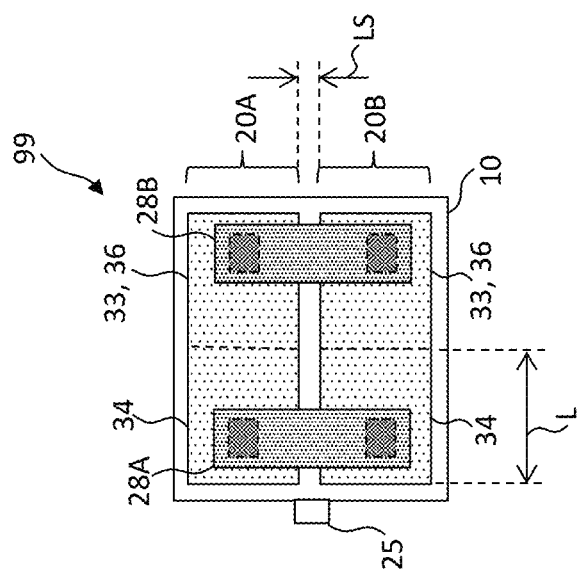

First and second LEDs 20A, 20B arranged as illustrated in FIGS. 7A-7C can be electrically connected serially or in parallel as shown in FIGS. 5 and 6. In some embodiments, the portions connected by LED electrode 28 are the same portion of first LED 20A and second LED 20B, for example both cantilever portions 34 or both emission portions 33. In that case, first and second LEDs 20A, 20B are electrically connected in parallel and are separated by LED emission separation distance LS smaller than cantilever length L as shown in FIG. 5. In some embodiments, the portion of first LED 20A connected by LED electrode 28 is different from the portion of second LED 20B connected by LED electrode 28. For example, if cantilever portion 34 of first LED 20A is connected by LED electrode 28 to emission portion 33 of second LED 20B (or vice versa), first and second LEDs 20A, 20B are electrically connected in serial and are separated by LED emission separation distance LS smaller than cantilever length L as shown in FIG. 6. Regardless of LED 20 arrangement, emission portions 33 are closer together than would be the case for LEDs 20 separately constructed and disposed on separate substrates, especially for packaged LEDs, improving the appearance of the light emitted by LEDs 20 and improving manufacturing efficiency by reducing the number of micro-transfer steps necessary to construct a multi-LED pixel or lamp (illuminator).

The embodiments of the present disclosure illustrated in FIGS. 5-7D have emission portions 33 separated by an LED emission separation distance LS that is less than a cantilever length L of cantilever portion 34 and have base portions 36 and cantilever portions 34 that extend in the same direction and have a common midline. The embodiments illustrated in FIGS. 8-23 have base portions 36 and emission portions 33 that extend in a direction different from the direction of cantilever portions 34, forming an L shape where the different directions are orthogonal, for example. In FIGS. 5-23, emission portions 33 overlap base portions 36 and can be labeled as such, as in FIGS. 5-6. For clarity, base portions 36 in FIGS. 8-23 are not labeled. LED 20 structures of FIGS. 3A-3C are used in FIGS. 8-21 but the structures of FIGS. 4A-4C could equally be used, or a combination thereof. L-shaped LEDs 20 as in FIGS. 8-21 can also be combined with straight LEDs 20 as in FIGS. 5-7D.

Figure 8:
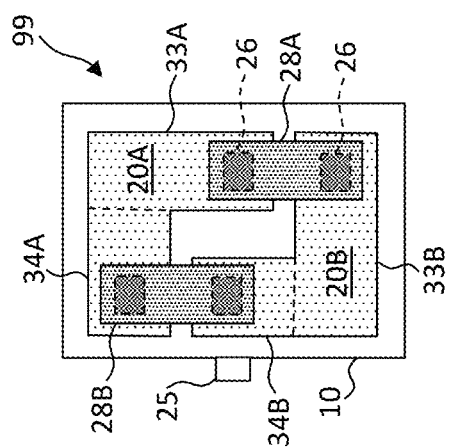
Figure 9:
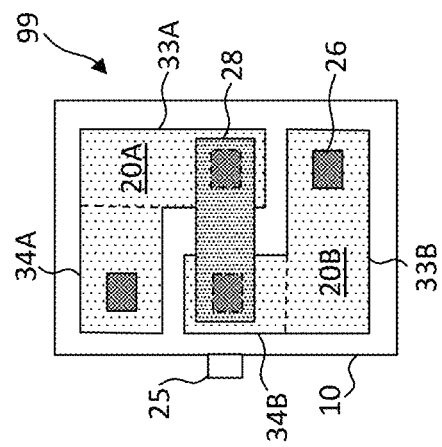
Figure 10:
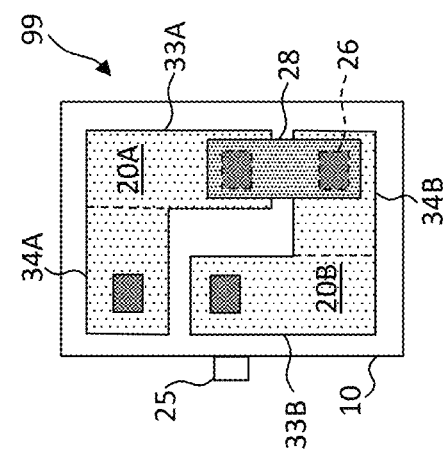
Figure 11:
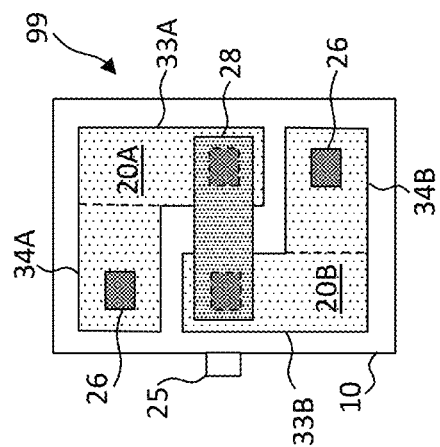

As shown in FIGS. 8 and 11, an L-shaped first LED 20A and an L-shaped second LED 20B are disposed on multi-LED native substrate 10 and electrically connected in parallel. LED contact pad 26 of first emission portion 33A of first LED 20A is electrically connected to LED contact pad 26 of second emission portion 33B of second LED 20B with first LED electrode 28A and LED contact pad 26 of first cantilever portion 34A of first LED 20A is electrically connected to LED contact pad 26 of second cantilever portion 34B of second LED 20B with second LED electrode 28B. As shown in FIGS. 9 and 10, an L-shaped first LED 20A and an L-shaped second LED 20B are disposed on multi-LED native substrate 10 and electrically connected in series. LED contact pad 26 of first emission portion 33A of first LED 20A is electrically connected to LED contact pad 26 of second cantilever portion 34B of second LED 20B with LED electrode 28. In the embodiments of FIGS. 9 and 11, first and second LED lengths E1, E2 are less than LED contact separation distance CS (as shown in FIG. 7A, not indicated in FIGS. 9 and 11) providing well-separated open LED contact pads 26 enabling lower-resolution electrical connections to open LED contact pads 26. The embodiments of FIGS. 8-11 comprise first or second LEDs 20A, 20B that are mirror reflections and rotations of each other and provide a compact arrangement of L-shaped first and second LEDs 20A and 20B in a multi-LED structure 99.

Figure 12:
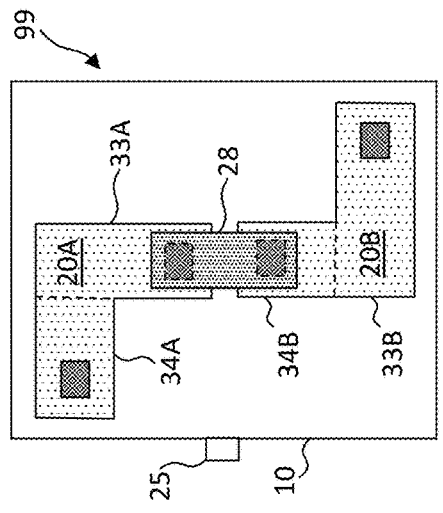
Figure 13:
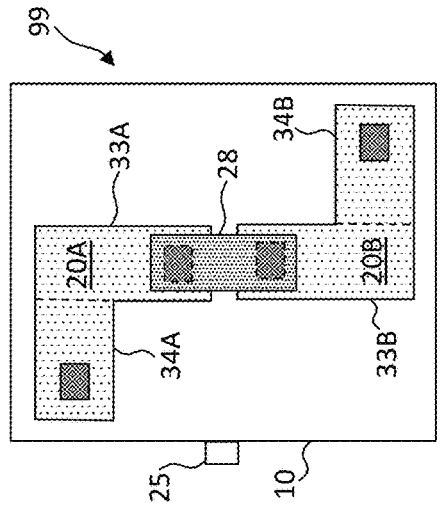
Figure 14:
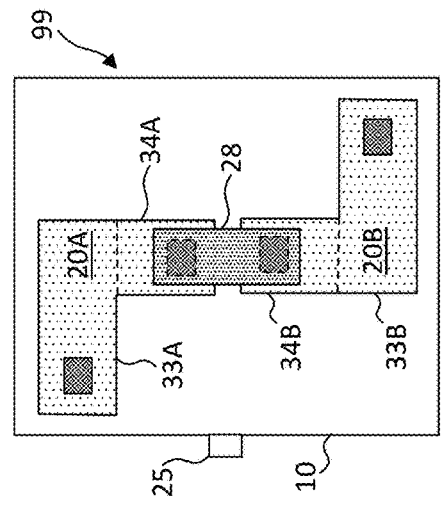
Figure 15:
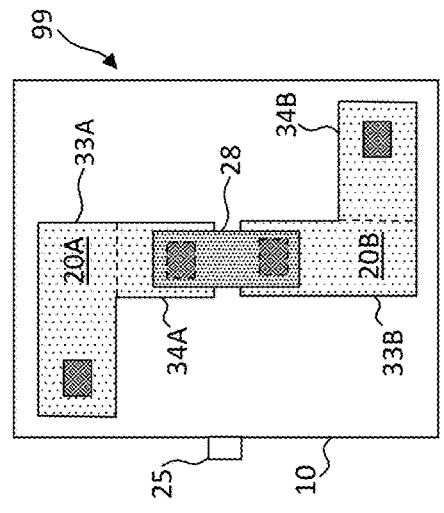

FIGS. 12-15 illustrate reflected and rotated arrangements of LEDs 20 with greater LED contact pad 26 separation different from the arrangements of FIGS. 8-11. Each of the embodiments of FIGS. 12-15 comprise L-shaped first and second LEDs 20A, 20B electrically connected with LED electrode 28 that are rotated mirror images of each other. The embodiments of FIGS. 12 and 15 are electrically connected in serial, since first emission portion 33A of first LED 20A is electrically connected to second cantilever portion 34B of second LED 20B, as in FIG. 12, and second emission portion 33B of second LED 20B is electrically connected to first cantilever portion 34A of first LED 20A, as in FIG. 15. The embodiments of FIGS. 13 and 14 are electrically connected in parallel, since first emission portion 33A of first LED 20A is electrically connected to second emission portion 33B of second LED 20B, as in FIG. 13, and first cantilever portion 34A of first LED 20A is electrically connected to second cantilever portion 34B of second LED 20B, as in FIG. 14. All of the embodiments of FIGS. 12-15 provide well-separated open LED contact pads 26 enabling low-resolution connections to open LED contact pads 26 (as illustrated in FIG. 7A).

Figure 16:
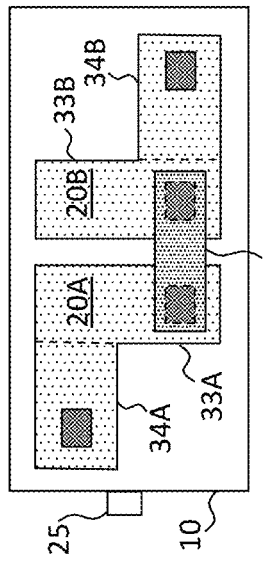
Figure 17:
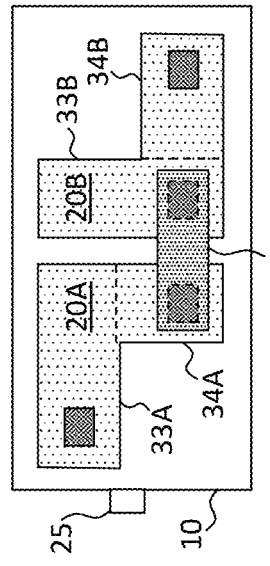
Figure 18:
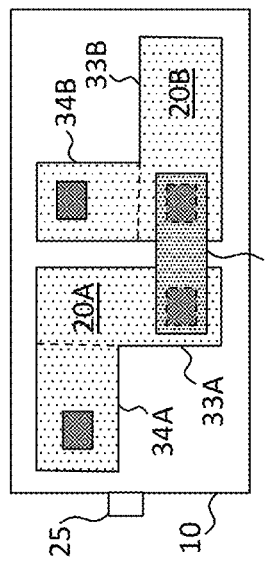
Figure 19:
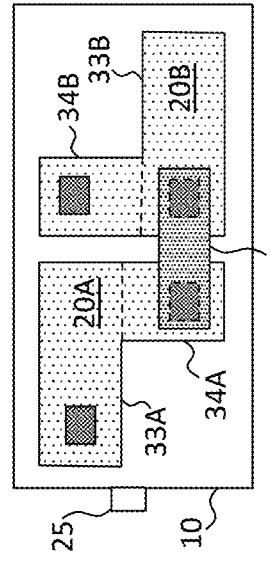

FIGS. 16-19 illustrate longer and narrower horizontal (or vertical) arrangements of LEDs 20 different from the arrangements of FIGS. 8-15. Each of the embodiments of FIGS. 16-19 comprise L-shaped first and second LEDs 20A, 20B electrically connected with LED electrode 28 that are rotated mirror images of each other. The embodiments of FIGS. 16 and 17 are electrically connected in parallel, since first emission portions 33A of first LED 20A are electrically connected to second emission portions 33B of second LED 20B. The embodiments of FIGS. 18 and 19 are electrically connected in serial, since first emission portions 33A of first LED 20A are electrically connected to second cantilever portions 34B of second LED 20B. The embodiments of FIGS. 17 and 19 provide well-separated open LED contact pads 26 enabling low-resolution connections to open LED contact pads 26 (e.g., as illustrated in FIG. 7A).

FIGS. 20-23 illustrate longer and narrower horizontal (or vertical) mirror arrangements of LEDs 20 different from the arrangements of FIGS. 8-19. Each of the embodiments of FIGS. 20-23 comprise L-shaped first and second LEDs 20A, 20B electrically connected with LED electrode 28 that are rotated mirror images of each other. The embodiments of FIGS. 20 and 23 are electrically connected in serial, since first emission portion 33A of first LED 20A is electrically connected to second cantilever portion 34B of second LED 20B, as in FIG. 20, and second emission portion 33B of second LED 20B is electrically connected to first cantilever portion 34A of first LED 20A, as in FIG. 23. The embodiments of FIGS. 21 and 22 are electrically connected in parallel, since first emission portion 33A of first LED 20A is electrically connected to second emission portion 33B of second LED 20B, as in FIG. 21, and first cantilever portion 34A of first LED 20A is electrically connected to second cantilever portion 34B of second LED 20B, as in FIG. 22. All of the embodiments of FIGS. 20-23 provide well-separated open LED contact pads 26 enabling low-resolution connections to open LED contact pads 26 (as illustrated in FIG. 7A).

Any mirror reflection, rotation, or mirror reflection and rotation about any axis, for example by 90, 180, or 270 degrees, of one or more of LEDs 20 in any illustrated configuration of the present disclosure are contemplated as embodiments of the present disclosure.

Any of the parallel-connected embodiments of FIGS. 5-23 can be constructed and electrically connected using the configuration of FIG. 1D or 1E. In some such embodiments, open LED contact pads 26 can be disposed anywhere suitable on multi-LED native substrate 10 separate from base portions 36 (and therefore emission portions 33) and can be separated as described to provide electrical contacts that can be connected using lower-resolution, coarse electrical connections (wires).

Figure 24A:
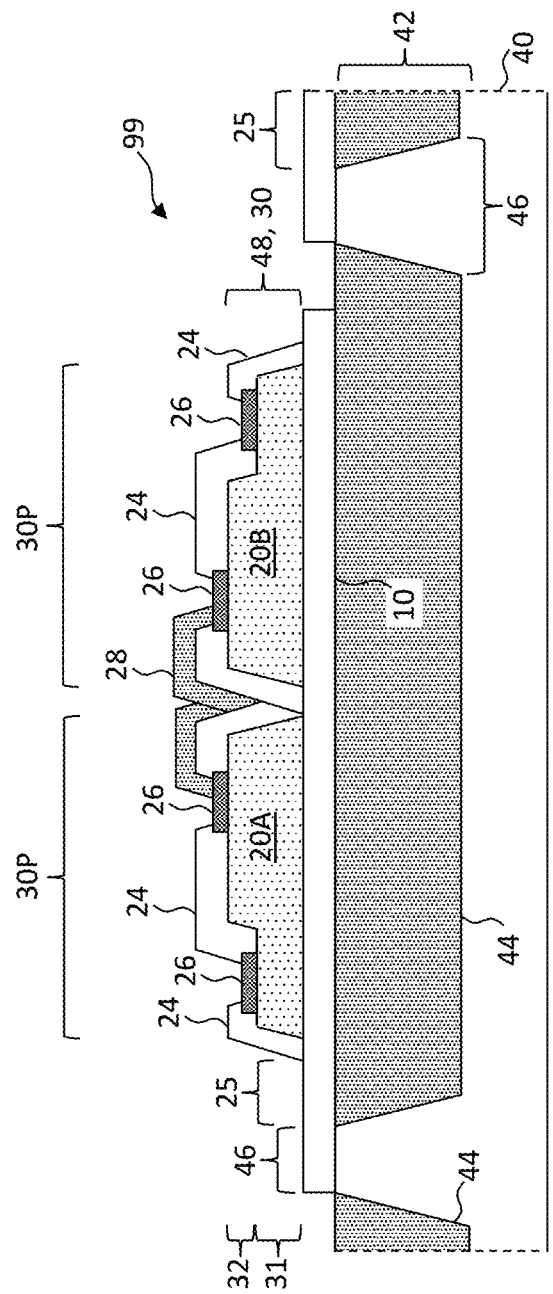
FIG. 24A is a schematic cross section of a multi-LED structure on a native source wafer and FIGS. 24B and 24C are schematic cross sections of a multi-LED structure on a native source wafer with a handle substrate according to illustrative embodiments of the present disclosure.

Multi-LED structures 99 of the present disclosure can be constructed on a native source wafer 40, for example a semiconductor or compound semiconductor wafer. As illustrated in FIG. 24A, a native source wafer 40 comprises a sacrificial layer 42 having sacrificial portions 44 separated by anchors 46. A multi-LED native substrate 10 is disposed directly over each sacrificial portion 44 and epitaxial layers 48 disposed on sacrificial portion 44 with or without seed layers. Sacrificial portions 44 can be, for example, anisotropically etchable portions of sacrificial layer 42 or patterned layers of material that are differentially etchable from multi-LED native substrate 10, such as oxide or nitride layers. Sacrificial portions 44 and anchor 46 of sacrificial layer 42 can include a same material (e.g., anisotropically etchable material) and be defined, at least in part, by their relative accessibility to an etchant applied to native source wafer 40. For example, in some embodiments, and as illustrated in FIG. 24A, an etchant can access sacrificial portions 44 through entry paths adjacent to multi-LED structures 99 such that sacrificial portions 44 are etched before the etchant reaches anchors 46. Epitaxial layers 48 (semiconductor layer 30) can comprise one or more layers of semiconductor material, for example compound semiconductor materials such as GaN, GaAs, or InP with or without dopants and are patterned using photolithographic methods and materials (e.g., by masked etching with patterned photoresist) to form separate semiconductor portions 30P. Any desired LED contact pads 26 are patterned, for example by depositing metal such as aluminum or a transparent conductive oxide such as indium tin oxide (e.g., by evaporation or sputtering) and patterning (e.g., by using mask-exposure photoresist followed by etching) over semiconductor portions 30P. Patterned dielectric layers 24 can be deposited and patterned (e.g., photolithographically patterned silicon dioxide or silicon nitride) to insulate parts of semiconductor portions 30P. LED electrode(s) 28 are patterned, for example similarly to LED contact pads 26, over multi-LED native substrate 10, patterned dielectric layers 24, and semiconductor portions 30P to form electrically connected LEDs 20. Sacrificial portions 44 can be etched to release multi-LED structure 99 from native source wafer 40 so that multi-LED structure 99 is only attached to anchor 46 by LED structure tether 25. Multi-LED structure 99 can then be transfer printed, for example micro-transfer printed.

Figure 24B:
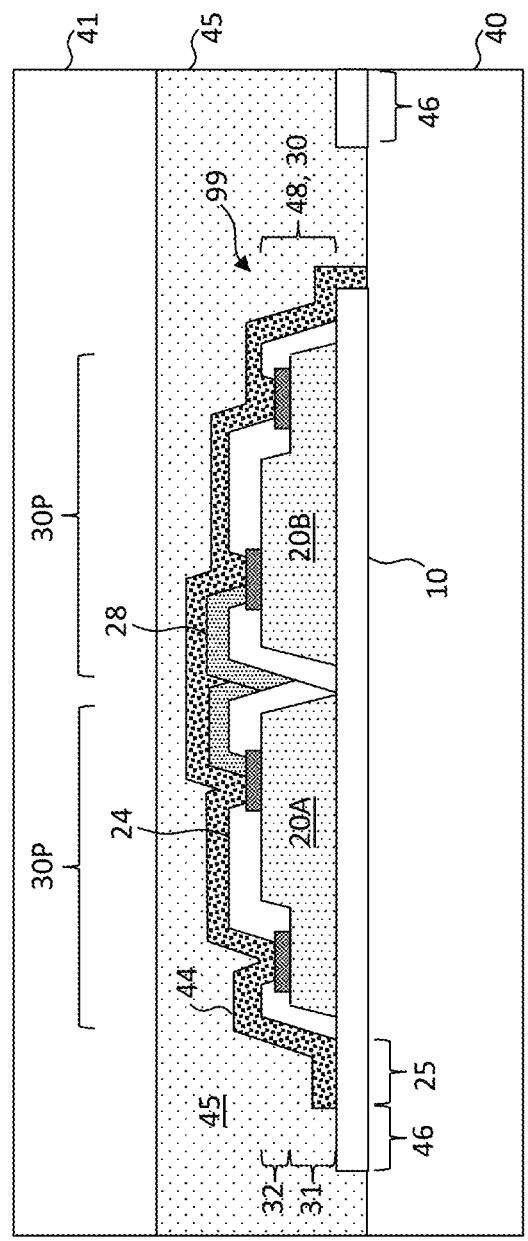
Figure 25:
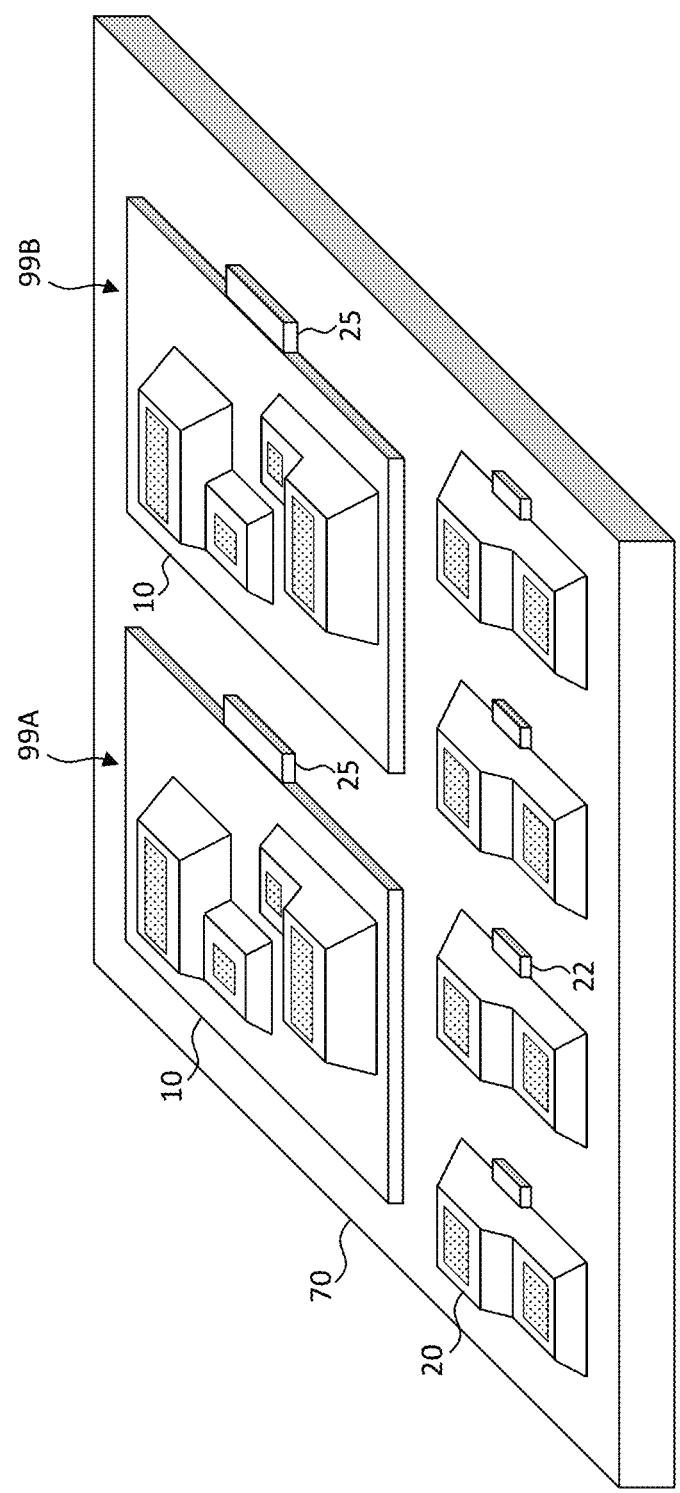
FIG. 25 is a schematic perspective of a component comprising multi-LED structures and LEDs illustrating embodiments of the present disclosure.

FIG. 24A illustrates a multi-LED structure 99 that is micro-transfer printable directly from native source wafer 40 to a target substrate 70, shown in FIG. 25. In some embodiments, for example as illustrated in FIG. 24B and further described in U.S. Pat. No. 10,224,231, multi-LED native substrate 10 does not include sacrificial layer 42 and sacrificial portions 44 as in FIG. 24A. Instead, patterned sacrificial portions 44 are deposited and patterned over multi-LED structure 99 and adhered with an adhesive layer 45 to a handle substrate 41 (handle wafer), native source wafer 40 is removed (e.g., by grinding or laser liftoff), and patterned sacrificial portions 44 etched away to release micro-transfer printable multi-LED structure 99 from handle substrate 41 and adhesive layer 45 so that multi-LED structure 99 is only attached to anchor 46 by LED structure tether 25. Inverted multi-LED structure 99 can then be micro-transfer printed to a desired target substrate 70, as shown in FIG. 25. Similarly, any individual LEDs 20 can be disposed on target substrate 70 by micro-transfer printing in an inverted state. Micro-transfer printed LEDs 20 can comprise fractured or separate tethers 22 and multi-LED structures 99 can comprise fractured or separated LED structure tethers 25 as a consequence of the micro-transfer printing process. Although not illustrated in FIG. 25, a controller (e.g., a pixel controller 66 as discussed with reference to FIGS. 27-30 below) can be disposed by micro-transfer printing onto target substrate 70 to control LEDs 20 and multi-LED structures 99 on target substrate 70 or onto multi-LED native substrate 10 to control LEDs 20 of multi-LED structures 99.

Figure 24C:
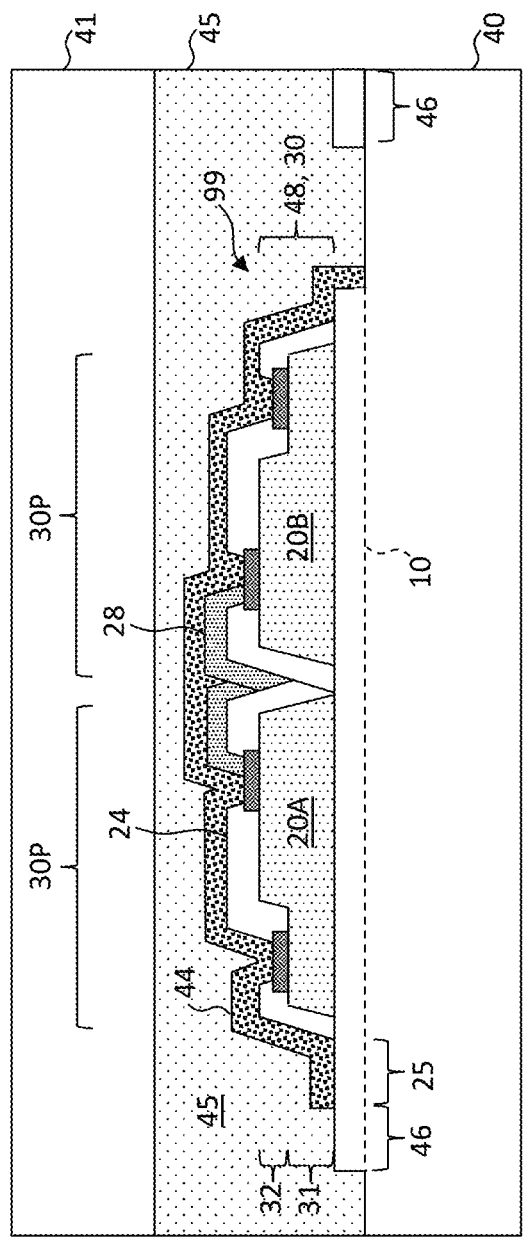

According to some embodiments of the present disclosure and as illustrated in FIG. 24C, multi-LED native substrate 10 is provided as a mesa 10M on native source substrate 40 and semiconductor layer 30 is disposed on mesa 10M. When native source substrate 40 is removed (step 230), mesa 10M (multi-LED native substrate 10) remains in place as a portion of multi-LED structure 99. For example, native source substrate 40 and multi-LED native substrate 10 (and mesa 10M) can be sapphire.

Some embodiments of the present disclosure comprise both multi-LED structures 99 of FIGS. 1A-2C and multi-LED structures 99 of FIGS. 3A-4C, for example disposed on a component, pixel, display, or illumination target substrate 70. Each multi-LED structure 99 can emit light of a specific color, for example, red, green, or blue, since LEDs 20 in each multi-LED structure 99 can be formed in a common process with common materials, for example a common epitaxial material such as compound semiconductor materials, like GaN, GaAs, or other LED materials, with suitable doping, and therefore emit the same color of light. A multi-color light-emitting device such as a pixel 60 or white-light lamp (illuminator) can comprise a multi-LED structure 99 with one or more separate, individual LEDs 20 or multiple different multi-LED structures 99 and, optionally, one or more separate, individual LEDs 20 that emit different colors of light. For example, and as shown in FIG. 25, first and second multi-LED structures 99A and 99B are disposed on target substrate 70. Target substrate 70 can be any one or more of a component substrate, pixel substrate, display substrate, or lamp (illuminator) substrate. First multi-LED structure 99A can emit a first color of light, for example red, and multi-LED structure 99B can emit a second color of light different from the first color of light, for example green. Either or both of first and second multi-LED structures 99A and 99B can comprise first and second LEDs 20A, 20B that are electrically serially connected or electrically connected in parallel. In some embodiments, LEDs 20 of first multi-LED structure 99A are connected in series and LEDs 20 of second multi-LED structure 99B are electrically connected in parallel. For example, red-light-emitting red LEDs 20R of a red multi-LED structure 99R can be electrically connected in series and green-light-emitting green LEDs 20G of a green multi-LED structure 99G can be electrically connected in parallel. A pixel 60 (for example used in a display or lamp) can comprise multi-LED structures 99 and individual LEDs 20, for example a blue-light-emitting blue LED 20B. In some embodiments, a pixel 60 comprises a series-connected set of different light-emitters that emit different colors of light, for example a red-light emitter, a green-light emitter, and a blue-light emitter controlled by a single control signal. Any one or more of the series-connected set of red-light emitter, green-light emitter, or blue-light emitter can be individual LEDs 20 or multi-LED structures 99. The series-connected set of light-emitters can be separately controlled from the colored-light emitters and together emit white light, and the white-point color of pixel 60 can be adjusted by controlling the luminance of the red, green, or blue light-emitters (e.g., LEDs 20 or multi-LED structures 99) with respect to the white color of light emitted by the series-connected set of light emitters.

Thus, embodiments of the present disclosure provide multi-LED structures 99 that, used individually, enable light-emitting products that are smaller in area, are more highly integrated, and are more efficiently incorporated in products by using micro-transfer printing. Moreover, devices using groups of multi-LED structures 99 and LEDs 20 that emit different colors of light can also have improved electrical power efficiency. Such devices can be, for example, displays or lamps (illuminators).

According to embodiments of the present disclosure, by providing series-connected multiple differently colored LEDs 20 that emit different colors of light controlled by a common control signal (e.g., to emit white light), a higher voltage can be applied to LEDs 20, improving power distribution and operating voltage to pixels 60 and reducing system power losses. For example, a series-connected set of light emitters with a red-light-emitting red LED 20R, a green-light-emitting green LED 20G, and a blue-light-emitting blue LED 20B can be operated at 8 volts, as can a series-connected four-LED multi-LED structure 99 of red-light-emitting red LEDs 20R (or two series-connected red-light-emitting multi-LED structures 99 comprising two red LEDS 20R), a series-connected two-LED (or three-LED) multi-LED structure 99 of green-light-emitting green LEDs 20G, and a series-connected three-LED multi-LED structure 99 of blue-light-emitting blue LEDs 20B.

Figure 26:
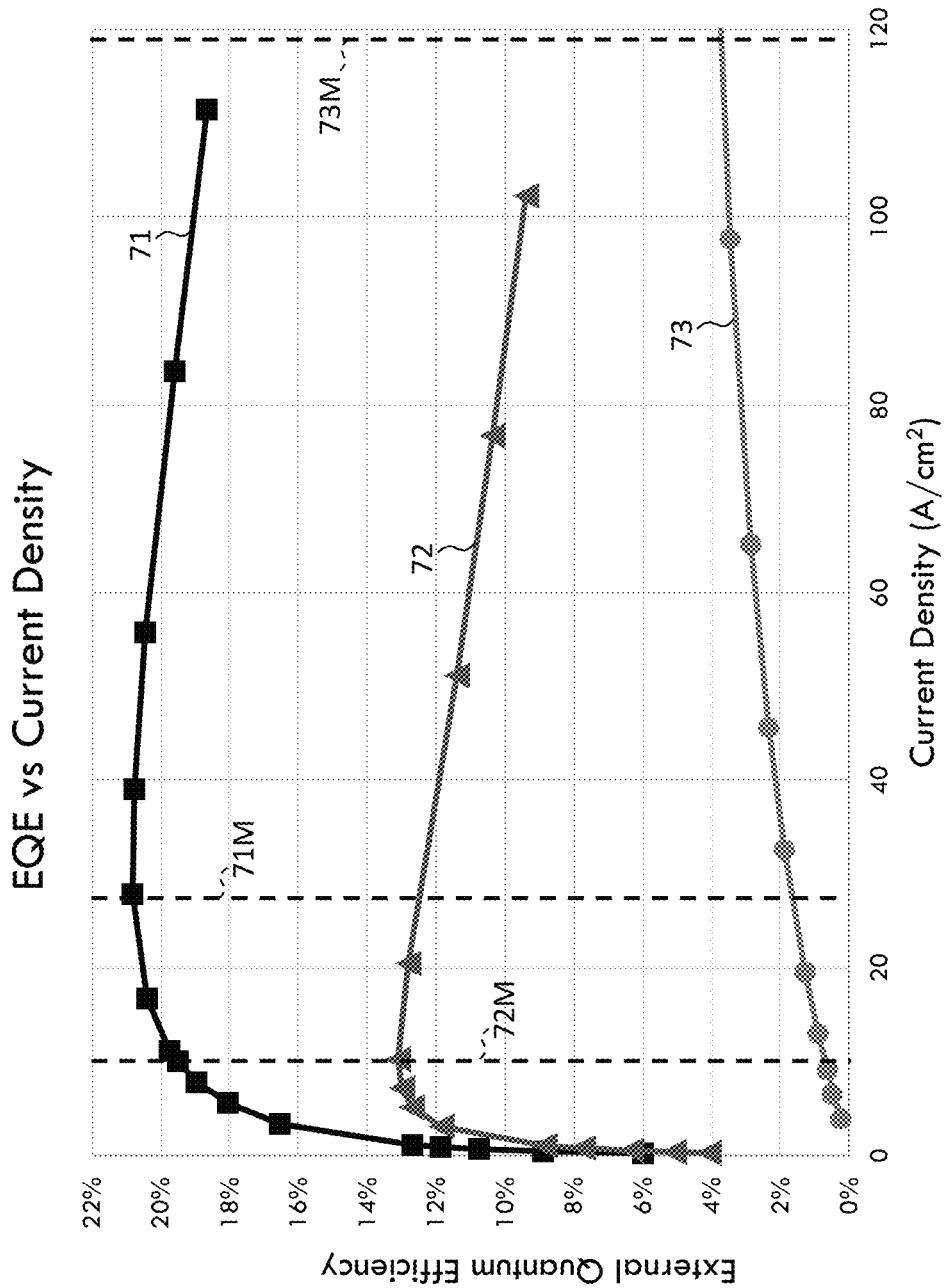
FIG. 26 is a graph illustrating inorganic LED light output efficiency with respect to current density useful in understanding embodiments of the present disclosure.

Referring to FIG. 26, according to some embodiments of the present disclosure, LEDs 20 that each emit a different color of light, for example red LED 20R that emits red light, green LED 20G that emits green light, and blue LED 20B that emits blue light, have different light-output efficiencies with respect to current density for the respective LEDs 20. According to some embodiments, different LEDs 20 can also have different preferred driving voltages, for example a forward voltage across the diode. As shown in FIG. 26, blue LED 20B has a blue efficiency vs. current density 71, green LED 20G has a green efficiency vs. current density 72, and red LED 20R has a red efficiency vs. current density 73 illustrated by the labeled lines of the graph. Blue efficiency vs. current density 71 has a blue efficiency maximum 71M, green efficiency vs. current density 72 has a green efficiency maximum 72M, and red efficiency vs. current density 73 has an approximate red efficiency maximum 73M (that can be at a greater current density than is shown in FIG. 26, given the limited data set acquired and plotted in FIG. 26).

As shown in FIG. 26, green LED 20G has green efficiency maximum 72M at a lower current density than blue efficiency maximum 71M. Both blue and green efficiency maximums 71M and 72M are at a lower current density than red efficiency maximum 73M. Green efficiency maximum 72M is at a current or current density that is approximately one half of blue efficiency maximum 71M. Therefore, if current is supplied to both a single blue LED 20B and a multi-LED structure 99 comprising two green LEDs 20G electrically connected in parallel (e.g., as shown in FIGS. 1A, 1B, 5, 8, 11 and others) at blue efficiency maximum 71M, the electrical current that passes through each green LED 20G will be one half the electrical current that passes through blue LED 20B and the current density passing through green LED 20G will likewise be one half that of the current density passing through blue LED 20B. In this configuration, both blue LED 20B and green LED 20G can operate at approximately maximum efficiency while using the same current supplied by a common current supply, improving their efficiency in a display or lamp 80 (as discussed further below with respect to FIGS. 27-30). (Both current and current density are referenced since, if LEDs 20 are the same size, current and current density are directly related.)

As shown in FIG. 26, red LED 20R is less efficient than blue or green LEDs 20B, 20G at a given current density. Moreover, according to some embodiments, red LEDs 20R can operate at a lower voltage than blue or green LEDs 20B, 20G. For example, blue-light-emitting compound semiconductor materials can emit light at voltages ranging from 2.5-3.7 volts, green-light-emitting compound semiconductor materials can emit light at voltages ranging from 1.9-4 volts, and red-light-emitting compound semiconductor materials can emit light at voltages ranging from 1.6-2 volts. Thus, blue and green LEDs 20B, 20G can operate effectively at a common voltage (e.g., 3.6 volts) but red LEDs 20R can require a different voltage. Providing such different voltages can require additional control or power circuitry in a display or lamp 80. Therefore, according to embodiments of the present disclosure, red LEDs 20R are provided in a series connected red multi-LED structure 99R used in a display, lamp, or indicator so that the driving voltage of red multi-LED structure 99R is greater than that of a single red LED 20R therein. Consequently, each red LED 20R in a red multi-LED structure 99R can be operated more efficiently by providing a more optimized driving voltage even while red multi-LED structure 99R itself is driven at the same voltage as parallel connected green and blue LEDs 20G, 20B.

Figure 27:
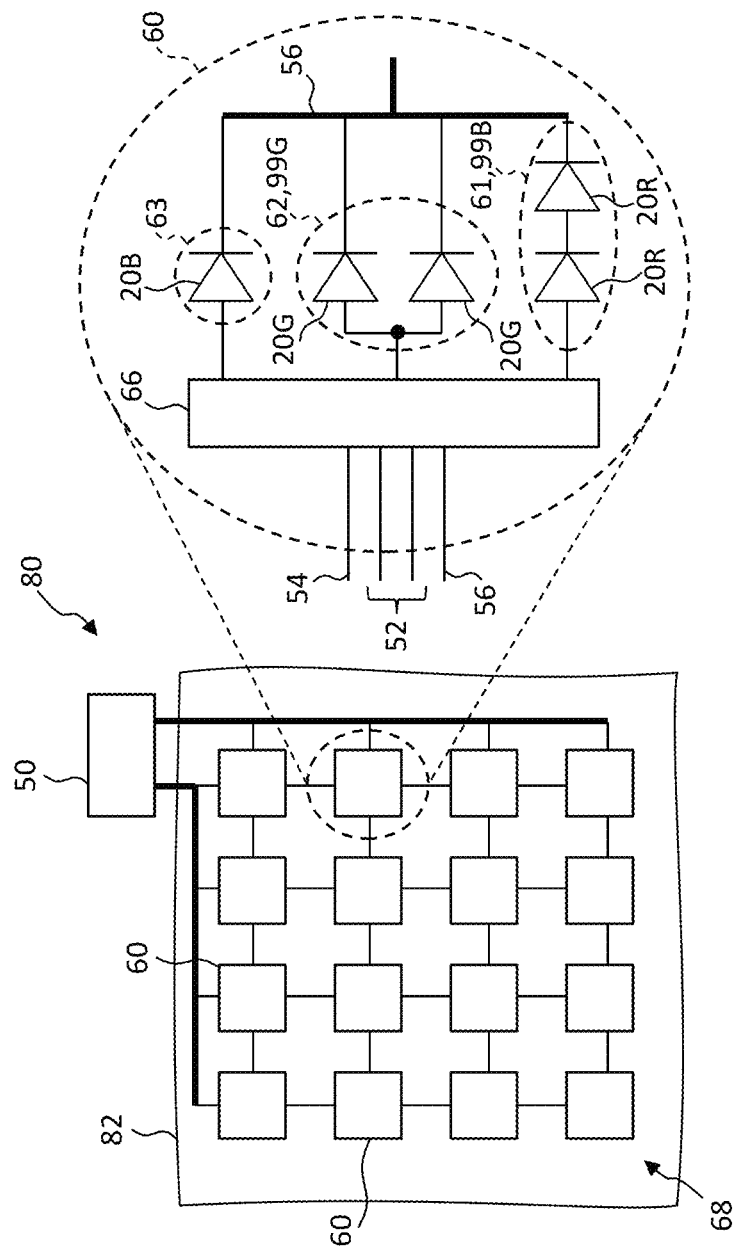
FIG. 27 is a schematic plan view and pixel detail of a display comprising multi-LED structures and LEDs illustrating embodiments of the present disclosure.

According to some embodiments of the present disclosure and as illustrated in FIG. 27, a display or lamp controller 50 or pixel controller 66 supplies pixels 60 and red, green, and blue LEDs 20R, 20G, 20B with a common voltage. For example, if two red LEDs 20R are connected in series at a given voltage, each of red LEDs 20R can be driven at one half the given voltage. For example, if 3.6 volts is provided to blue, green, and red LEDs 20B, 20G, 20R, blue and green LEDs 20B, 20G can be driven at 3.6 volts and two red LEDs 20R are each driven at 1.8 volts because they are electrically connected in series. Furthermore, if two sets of LEDs 20 as described are electrically connected in series, doubling the driving voltage to 7.2-8 volts, the driving voltage can be approximately equal to the voltage used to drive series-connected red, green, and blue LEDs 20R, 20G, 20B. Green LEDs 20G can be connected in parallel as part of a green multi-LED structure 99G and red LEDs 20R can be connected in series as part of a red multi-LED structure 99R. Therefore, according to embodiments of the present disclosure, providing a higher voltage color light-emitting system (e.g., a display or lamp 80) and using series- and parallel-connected multi-LED structures 99 and LEDs 20 increases system power efficiency and also increases LED 20 light-emitting efficiency by optimizing LED driving voltage and current density, and therefore external quantum efficiency.

A matrix-addressed display 80 (or lamp 80) with pixels 60 using multi-LED structures 99 is illustrated in FIGS. 27-30. As shown in these Figures, pixels 60 are arranged in a pixel array 68 on a display or lamp substrate 82 or any other desired substrate. Embodiments of the present disclosure are not limited to display or lamp applications. Each pixel 60 comprises a pixel controller 66 driven by a power/voltage signal 54, ground 56, and control signals 52 (e.g., a row control signal and a column control signal). As shown in FIG. 27, each pixel 60 comprises a blue sub-pixel 63 comprising a blue LED 20B, a green sub-pixel 62 comprising a green multi-LED structure 99G having green LEDs 20G electrically connected in parallel, and a red sub-pixel 61 comprising a red multi-LED structure 99R having red LEDs 20R electrically connected in series. Red, green, and blue sub-pixels 61, 62, 63 can be driven at a common voltage and with more efficient current density and quantum efficiency.

Figure 28:
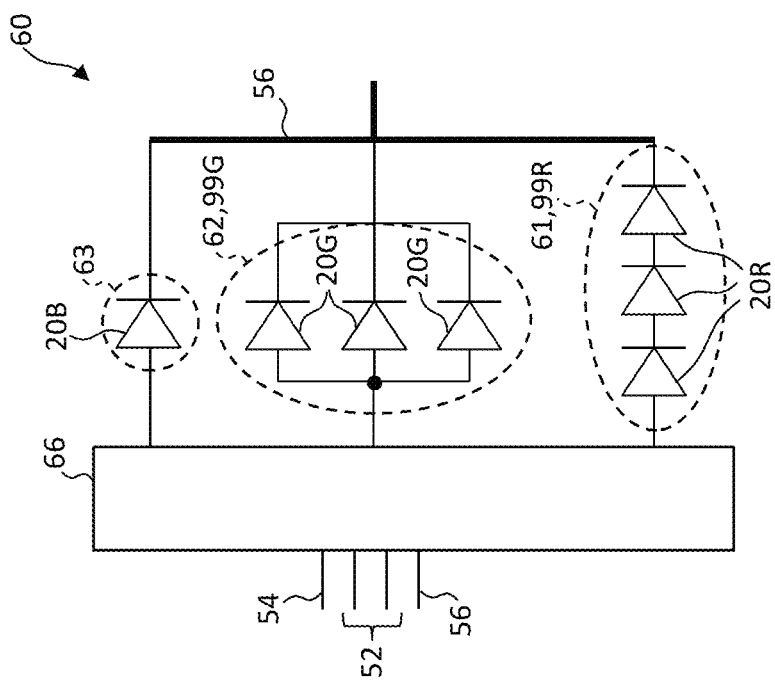
FIGS. 28-30 are schematic display pixel details comprising multi-LED structures and LEDs illustrating embodiments of the present disclosure.

As shown in FIG. 28, blue sub-pixel 63 can comprise one blue LED 20B, green sub-pixel 62 can comprise three green LEDs 20G electrically connected in parallel in one green multi-LED structure 99G, and red sub-pixel 61 can comprise three red LEDs 20R electrically connected in series in one red multi-LED structure 99R. Such arrangements of LEDs 20 and multi-LED structures 99 can improve system power efficiency.

Figure 29:
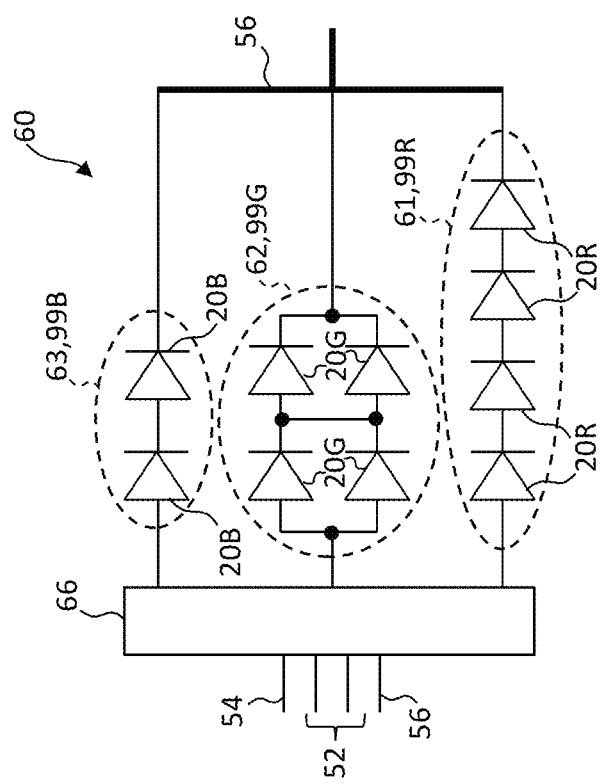

As illustrated in the embodiment of FIG. 29, blue sub-pixel 63 can comprise two blue-light-emitting blue LEDs 20B in a blue multi-LED structure 99B. Green sub-pixel 62 can comprise four green LEDs 20G in one or two green multi-LED structures 99G that emit green light. For example, four green LEDs 20G can be electrically connected in series and parallel in one green multi-LED structure 99G as shown, two series-connected green multi-LED structures 99G each comprising two green LEDs 20G connected in parallel, or two parallel-connected green multi-LED structures 99G each comprising two green LEDs 20G connected in series. Red sub-pixel 61 can comprise four red LEDs 20R electrically connected in series that emit red light in one red multi-LED structure 99R or two series-connected red multi-LED structures 99R each comprising two red LEDs 20R electrically connected in series.

Figure 30:
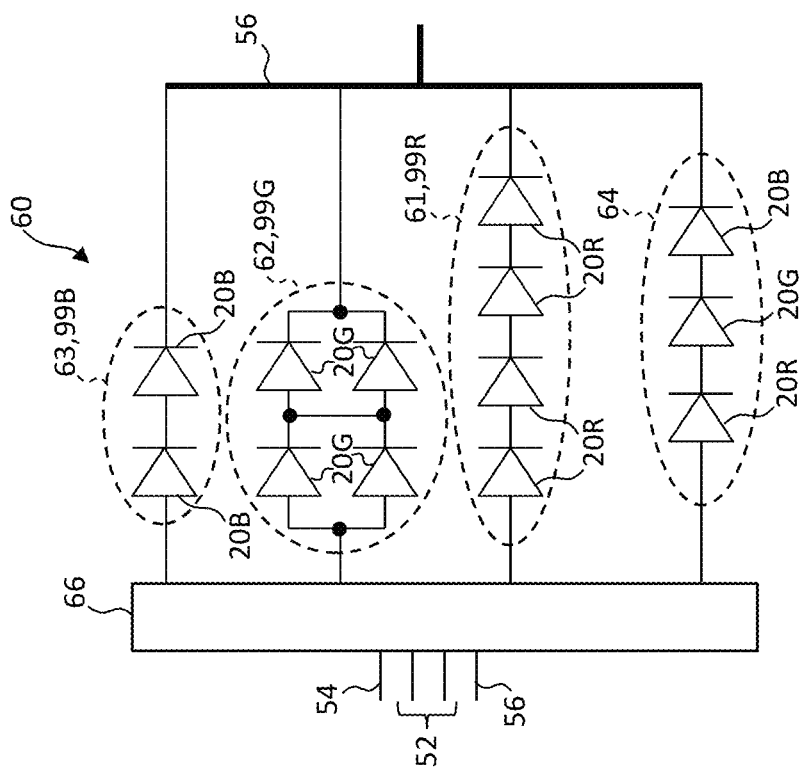

As illustrated in the embodiment of FIG. 30, red, green, and blue sub-pixels 61, 62, 63 can be connected as illustrated in FIG. 29. In addition, a white-light emitting white sub-pixel 64 comprises a series-connected combination of red, green, and blue LEDs 20R, 20G, 20B that together emit white light. Red, green, blue, and white sub-pixels 61, 62, 63, 64 can be driven at a common voltage greater than the driving voltage of at least one and, in some embodiments any, single LED 20 and each of the color sub-pixels are controlled with approximately their best light-emitting efficiency. Such an arrangement, as in FIG. 29, can use double the driving voltage and consequently reduce power losses in a display or lamp 80 system.

Figure 31:
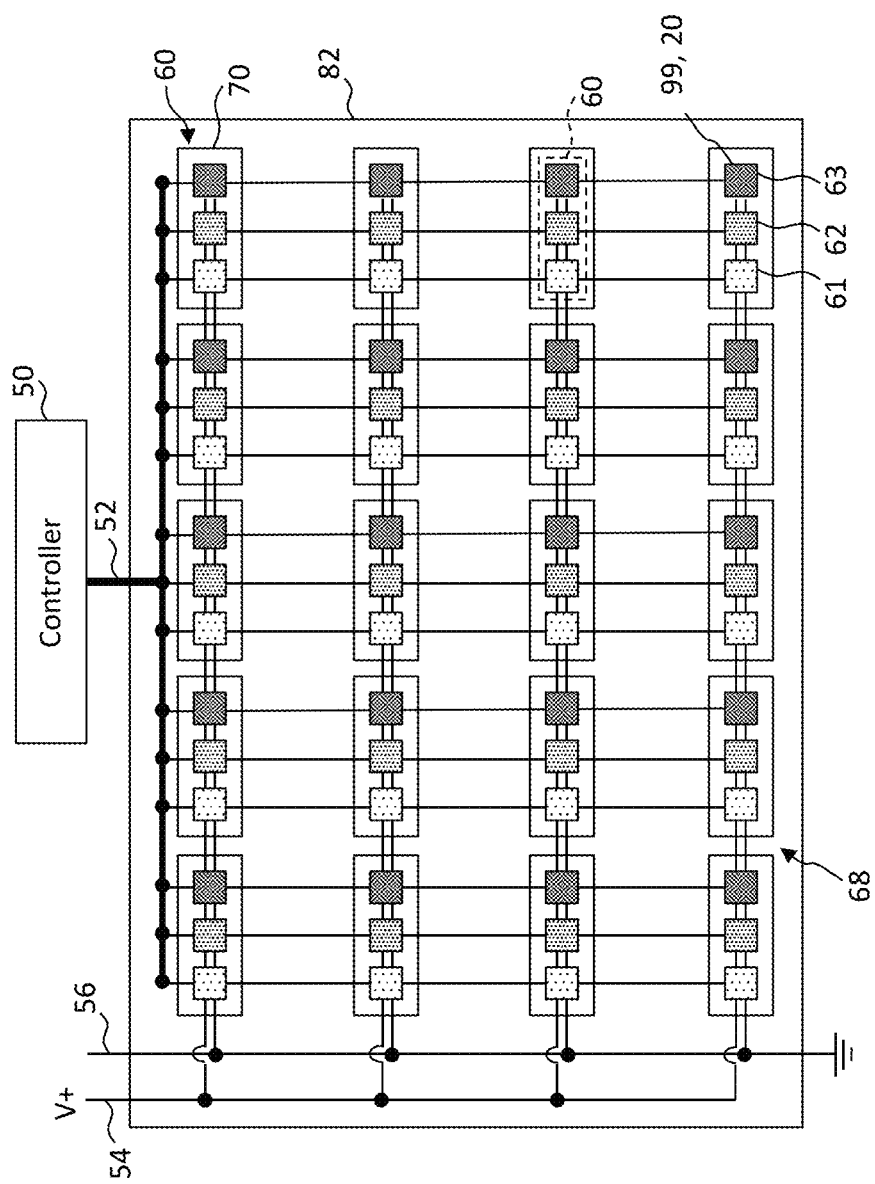
FIG. 31 is a schematic diagram of an active-matrix display comprising multi-LED structures illustrating embodiments of the present disclosure.
Figure 32:
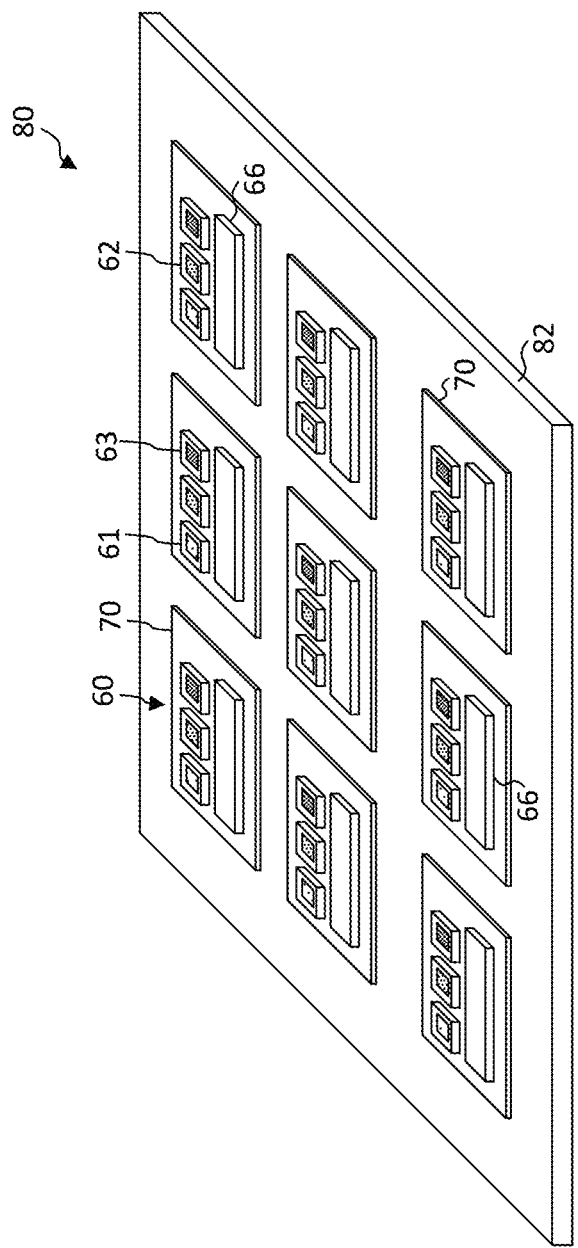
FIG. 32 is a schematic perspective of an active-matrix display according to illustrative embodiments of the present disclosure.

As shown in FIG. 31, a display or lamp 80 according to embodiments of the present disclosure can comprise a pixel array 68 of pixels 60 disposed on a display or lamp substrate 82 and controlled by controller 50 with power and ground signals 54, 56 and control signals 52. Each pixel 60 comprises red, green, and blue sub-pixels 61, 62, 63 (and optionally white sub-pixel 64, not shown) disposed on a target (pixel) substrate 70 and comprises one or more multi-LED structures 99 and, optionally, LEDs 20, for example as illustrated in any of FIGS. 25 and 27-30. FIG. 32 is a schematic structural perspective of the structure of FIG. 31 with the addition of a pixel controller 66 and without the electrical connections indicated in FIG. 31. In some embodiments, pixel 60 is an active-matrix pixel with a pixel controller 66. In some embodiments, pixel 60 is a passive-matrix pixel and does not include a pixel controller 66 (not shown).

Figure 33:
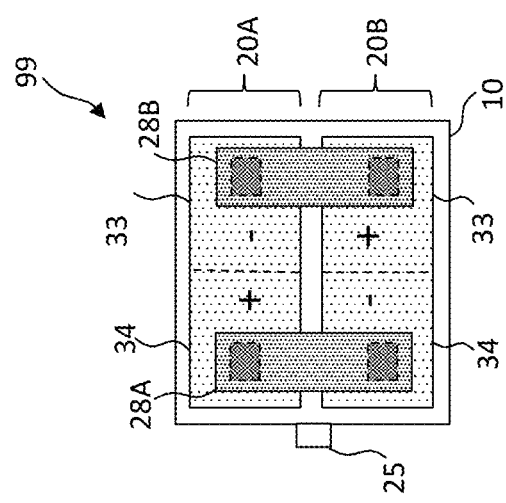
FIG. 33 is a schematic plan view illustrating reverse-bias electrical connections within multi-LED structures according to embodiments of the present disclosure.

In some embodiments of the present disclosure and as illustrated in FIG. 33, multi-LED structures 99 comprise at least one LED 20 biased in a forward direction and one LED 20 biased in an opposite direction. As shown in FIG. 33, first LED 20A is biased in one direction, indicated by the '+' symbol on emission portion 33 and '−' symbol on cantilever portion 34 and second LED 20B is biased in an opposite direction, indicated by the '+' symbol on cantilever portion 34 and '−' symbol on emission portion 33. Thus, if multi-LED structure 99 is driven by an alternating current, multi-LED structure 99 can emit light in both positive and negative cycles, alternately from first LED 20A and second LED 20B.

Figure 34:
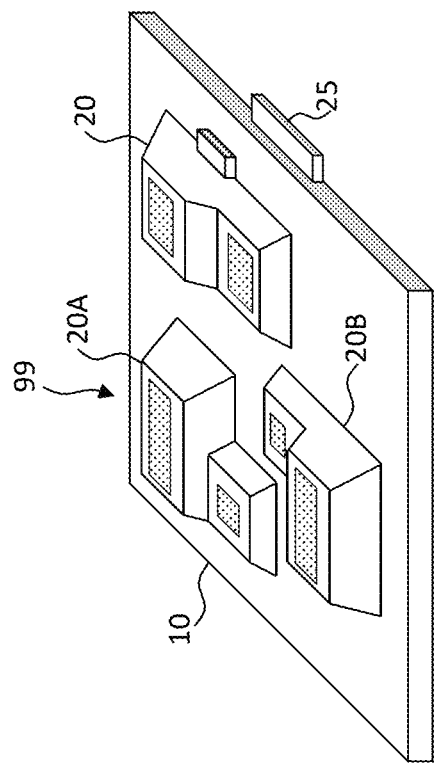
FIG. 34 is a schematic perspective of an individual LED disposed on a multi-LED native substrate of a multi-LED structure according to illustrative embodiments of the present disclosure.

As shown in FIG. 34, additional non-native LEDs 20 can be disposed on multi-LED native substrate 10 of multi-LED structure 99, for example by micro-transfer printing the additional LEDs 20 onto multi-LED native substrate 10. The additional LED 20 and native first and second LEDs 20A, 20B of multi-LED structure 99 can be electrically connected in a common step with common materials.

Figure 35:
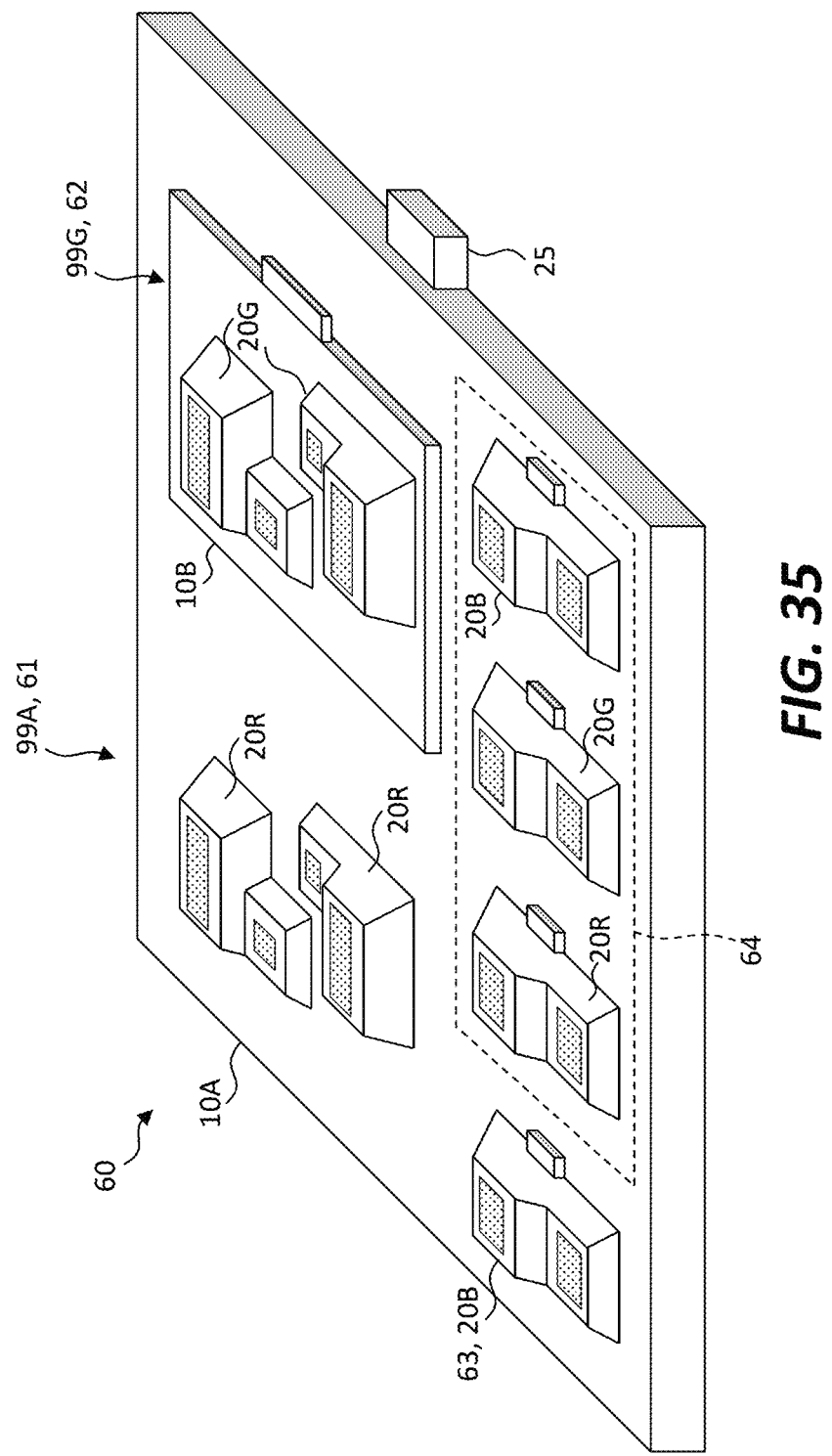
FIG. 35 is a schematic perspective of a multi-LED structure and individual LEDs disposed on a multi-LED native substrate of another multi-LED structure according to illustrative embodiments of the present disclosure.

Furthermore, according to some embodiments, a multi-LED structure 99 can comprise additional multi-LED structures 99 disposed on multi-LED native substrate 10, as shown in FIG. 35 with first multi-LED structure 99A comprising first multi-LED native substrate 10A and second multi-LED structure 99B comprising second multi-LED native substrate 10B, disposed on first multi-LED native substrate 10A, together with additional LEDs 20. LEDs 20 of multi-LED structure 99 and any LEDs 20 disposed directly on multi-LED native substrate 10 can comprise a semiconductor material different from the semiconductor material of semiconductor layer 30, for example so that the different LEDs 20 can emit different colors of light and form a display pixel 60 or lamp light-emitter. Thus, all of LEDs 20 of an entire pixel 60 or multi-color emitter (e.g., as shown in FIGS. 27-30), possibly including additional multi-LED structures 99 can be disposed on a multi-LED native substrate 10 and can be a micro-transfer printable structure. For example, FIG. 35 illustrates a series-connected red-light-emitting red multi-LED structure 99R (e.g., as shown in FIGS. 6, 9) with a green-light-emitting green multi-LED structure 99G (e.g., as shown in FIGS. 5, 8) disposed on first multi-LED native substrate 10A of red multi-LED structure 99R together with a blue-light-emitting blue LED 20B (electrically connected as shown in FIG. 27) and a series-connected white-light sub-pixel 64 comprising a red LED 20R, a green LED 20G, and a blue LED 20B (electrically connected as shown in FIG. 30) to construct a pixel 60. In an active-matrix embodiment, pixel controller 66 can also be micro-transfer printed to first multi-LED native substrate 10A (not shown).

Figure 36:
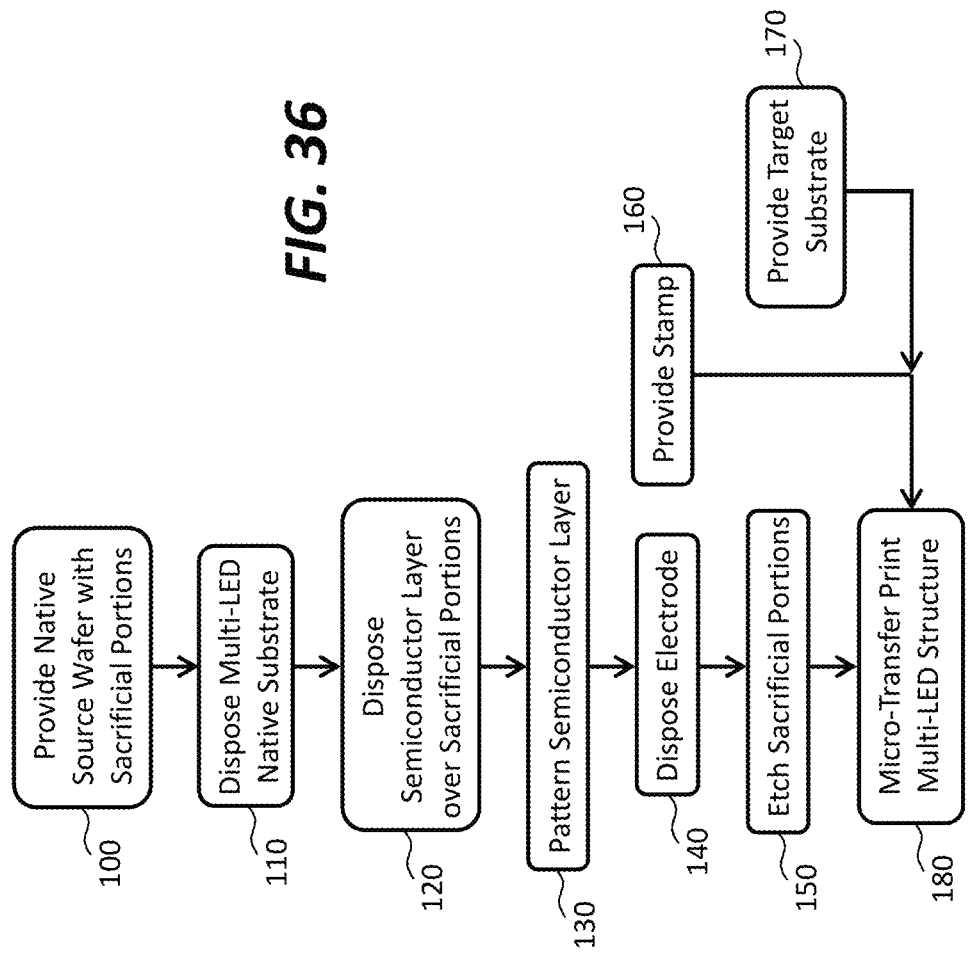
FIGS. 36 and 37 are flow charts according to illustrative embodiments of the present disclosure.

According to embodiments of the present disclosure and as illustrated in FIG. 36, a method of making a multi-LED structure 99 comprises providing a native source wafer 40 with sacrificial portions 44 in step 100, disposing a single, unitary, and contiguous multi-LED native substrate 10 in step 110 with or without a seed layer directly on or over sacrificial portions 44, disposing semiconductor layers 30 on multi-LED native substrate 10 in step 120, and patterning semiconductor layers 30 in step 130 to form spatially separated semiconductor portions 30P, semiconductor portions 30P defining at least a first LED 20A and a second LED 20B separate from first LED 20A. First LED 20A and second LED 20B each comprise (i) a first layer 31 having a cantilever portion 34 and a base portion 36, and (ii) a second layer 32 disposed only over base portion 36 of first layer 31 forming emission portion 33. In some embodiments, cantilever portion 34 of first LED 20A extends in a first direction D1 and base portion 36 of first LED 20A extends in a second direction D2 different from first direction D1. In some embodiments, cantilever portion 34 of first LED 20A has a first cantilever length L1, cantilever portion 34 of second LED 20B has a second cantilever length L2, and an LED emission separation distance LS between a light-emitting area of first LED 20A emission portion 33 and a light-emitting area of second LED 20B emission portion 33 is less than or equal to first cantilever length L1 or less than or equal to second cantilever length L2, and in some embodiments, both are true.

In step 140, an LED electrode 28 is disposed on at least a portion of multi-LED native substrate 10 or a non-semiconductor structure in semiconductor first layer 31 (e.g., a patterned dielectric layer 24, and disposed on at least a portion of first LED 20A and on at least a portion of second LED 20B so that LED electrode 28 electrically connects first LED 20A to second LED 20B.

According to some embodiments, sacrificial portions 44 are etched to release multi-LED structures 99 from native source wafer 40 in step 150, a stamp is provided in step 160, a target substrate 70 is provided in step 170, and multi-LED structures 99 are micro-transfer printed from native source wafer 40 to target substrate 70 with the stamp in step 180. This process corresponds to the native source wafer structure of FIG. 24A. In the illustrative method of FIG. 36, multi-LED structures 99 can be disposed by a stamp on display or lamp substrate 82 with first layer 31 between second layer 32 and display or lamp substrate 82 (or target substrate 70) so that first layer 31 is on or adjacent to display or lamp substrate 82. If an inverted printed multi-LED structures 99 with second layer 32 between first layer 31 and display or lamp substrate 82 is desired, a second stamp can remove multi-LED structures 99 from the stamp that retrieved multi-LED structures 99 from native source wafer 40 and then print them to display or lamp substrate 82.

Figure 37:
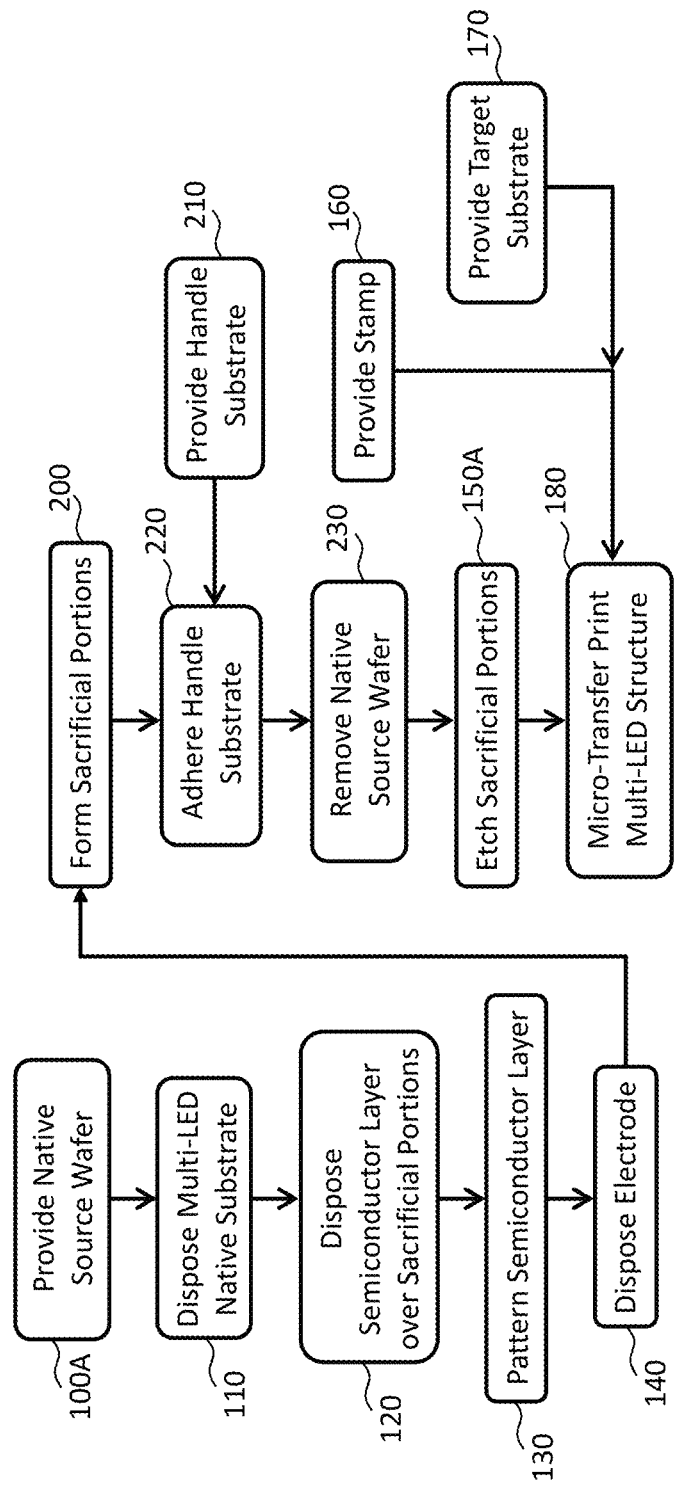

According to embodiments of the present disclosure and as illustrated in FIG. 37, a method of making a multi-LED structure 99 comprises providing a native source wafer 40 in step 100A, disposing single, unitary, and contiguous multi-LED native substrate 10 in step 110 with or without a seed layer, disposing semiconductor layers 30 on multi-LED native substrate 10 in step 120, and patterning semiconductor layers 30 in step 130 to form spatially separated semiconductor portions 30P, the semiconductor portions 30P defining at least a first LED 20A and a second LED 20B separate from first LED 20A. First LED 20A and second LED 20B each comprise (i) a first layer 31 having a cantilever portion 34 and a base portion 36, and (ii) a second layer 32 disposed only over base portion 36 of first layer 31 forming emission portion 33. In some embodiments, cantilever portion 34 of first LED 20A extends in a first direction D1 and base portion 36 of first LED 20A extends in a second direction D2 different from first direction D1. In some embodiments, cantilever portion 34 of first LED 20A has a first cantilever length L1, cantilever portion 34 of second LED 20B has a second cantilever length L2, and an LED emission separation distance LS between a light-emitting area of first LED 20A emission portion 33 and a light-emitting area of second LED 20B emission portion 33 is less than or equal to first cantilever length L1 or less than or equal to second cantilever length L2, and in some embodiments, both are true.

In step 140, an LED electrode 28 is disposed on at least a portion of single, unitary, and contiguous multi-LED native substrate 10 or non-semiconductor structure in semiconductor layer 30 and disposed on at least a portion of first LED 20A and on at least a portion of second LED 20B, LED electrode 28 electrically connecting first LED 20A to second LED 20B.

In step 200, sacrificial portions 44 (release layers) are disposed and patterned over LED 20, a handle substrate 41 is provided in step 210, and in step 220 handle substrate 41 is adhered to sacrificial portions 44 with adhesive layer 45. In step 230, native source wafer 40 is removed, e.g., by grinding or laser lift-off, leaving multi-LED structure 99 adhered with adhesive layer 45 to handle substrate 41.

According to some embodiments, sacrificial portions 44 are etched to release multi-LED structures 99 from native source wafer 40 in step 150A, a stamp is provided in step 160, a target substrate 70 is provided in step 170, and multi-LED structures 99 are micro-transfer printed from native source wafer 40 to target substrate 70 with the stamp in step 180. This process corresponds to the native source wafer structure of FIG. 24B. In the illustrative method of FIG. 37, multi-LED structures 99 can be disposed by a stamp on display or lamp substrate 82 (target substrate 70) in an inverted arrangement with second layer 32 between first layer 31 and display or lamp substrate 82 so that second layer 32 is on or adjacent to display or lamp substrate 82. If a non-inverted printed multi-LED structures 99 with first layer 31 between second layer 32 and display or lamp substrate 82 is desired, a second stamp can remove multi-LED structures 99 from the stamp that retrieved multi-LED structures 99 from native source wafer 40 and then print them to display or lamp substrate 82.

The arrangements of LEDs 20 and multi-LED structures 99 in FIGS. 27-30 can improve system power efficiency by using a common (and optionally greater) voltage for the sub-pixels and electrically connecting LEDs 20 and multi-LED structures 99 to match current densities and quantum efficiencies of sub-pixels to LED 20 characteristics for approximately best efficiencies. For example, in embodiments comprising LEDs 20 having the characteristics illustrated in FIG. 26, a driving voltage can be approximately 8 volts or in a range of 7 to 9 volts while operating individual LEDs 20 at approximately their most efficient current density and voltage.

In some embodiments of the present disclosure, LEDs 20 are inorganic light-emitting diodes. As used herein, two LEDs 20 that are serially connected are two LEDs 20 that are electrically connected in serial, so that the first terminal of an LED 20 is electrically connected to the second terminal of another LED 20. The remaining two terminals are electrically connected to common voltage signal 54 or common ground signal 56 and a control signal 52, for example provided by controller 50 or pixel controller 66. The first terminals of two LEDs 20 that are electrically connected in parallel are connected together and the second terminals of the two parallel-connected LEDs 20 are likewise connected together. The first and second terminals are electrically connected to common voltage signal 54 or common ground signal 56 and a control signal 52, for example provided by pixel controller 66. Both LEDs 20 can be biased in the same forward direction.

According to embodiments of the present disclosure, display or lamp substrate 82 is a substrate having substantially parallel and opposing sides, on one of which target substrates 70 are disposed for example by surface mount techniques. In some embodiments, LEDs 20 and multi-LED structures 99 are disposed directly on display or lamp substrate 82, for example by micro-transfer printing. Display or lamp substrate 82 can be a glass, polymer, ceramic, or metal substrate having at least one side suitable for constructing electrical conductors. Display or lamp substrate 82 or target substrate 70 can have a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm) and can be, but is not necessarily, transparent (e.g., at least 50%, at least 70%, at least 80%, or at least 90% transparent to visible light).

Common power and ground signals 54, 56 can be made using photolithographic, printed circuit board, inkjet, or display techniques and materials, for example using copper, aluminum, or silver materials to form patterned electrical conductors that conduct electrical control 52 and power signals 54 to pixels 60 to enable pixels 60 to display information or emit light, for example for an image, illuminator (lamp), or indicator. The electrical conductors can be electrically conductive metal wires formed, or disposed on, display or lamp substrate 82 using, for example, photolithographic methods, tools, and materials. Similarly, electrodes can be made using photolithographic methods, tools, and materials.

Target substrate 70 can also be glass or plastic or can be a semiconductor, such as silicon. Target substrate 70 can be transparent or opaque and, if transparent, light emitted from LEDs 20 can be transmitted through target substrate 70, depending on the orientation of LEDs 20 (e.g., top-emitting or bottom-emitting).

Native source wafers 40 can be compound semiconductor or silicon wafers and patterned sacrificial layer 42, LED structure tethers 25, and LEDs 20 can be made using photolithographic methods and materials found in the integrated circuit industries. For example, a source wafer can be GaN, InGaN, or GaAs. Inorganic light-emitting diodes 20 can be made in a semiconductor material, such as a compound semiconductor (e.g., GaN or GaAs, with or without doping). The semiconductor material can be crystalline. Any one or each of LEDs 20 can have at least one of a width from 2 to 50 μm (e.g., 2 to 5 μm, 5 to 10 μm, 10 to 20 μm, or 20 to 50 μm), a length from 2 to 50 μm (e.g., 2 to 5 μm, 5 to 10 μm, 10 to 20 μm, or 20 to 50 μm), and a height from 2 to 50 μm (e.g., 2 to 5 μm, 5 to 10 μm, 10 to 20 μm, or 20 to 50 μm).

In some embodiments, in operation, power 54, ground 56, and control signals 52 (e.g., row signals and column signals) are applied to electrical conductors on display or lamp substrate 82. The electrical conductors on display or lamp substrate 82 are in electrical contact with multi-LED structure 99 and any other LEDs 20 and supply electrical power at a desired voltage to common power signal 54, supply an electrical ground to common ground signal 56, and supply control signals 52 to multi-LED structures 99 and LEDs 20. The ground 56, voltage 54, and control signals 52 are electrically conducted through LED electrodes 28 and electrodes formed on target substrate 70 an any display or lamp substrate 82 to LEDs 20, any pixel controller 66, and any display or lamp controller 50 to control LEDs 20 and multi-LED structures 99 to emit light.

Methods of forming useful micro-transfer printable structures are described, for example, in the U.S. Pat. No. 8,889,485. For a discussion of micro-transfer printing techniques see, U.S. Pat. Nos. 8,722,458, 7,622,367 and 8,506,867, the disclosures of which are hereby incorporated by reference in their entirety. Micro-transfer printing using compound micro-assembly structures and methods can also be used with the present disclosure, for example, as described in U.S. patent application Ser. No. 14/822,868, filed Aug. 10, 2015, entitled Compound Micro Assembly Strategies and Devices, the disclosure of which is hereby incorporated by reference in its entirety. In some embodiments, pixel 60 is a compound micro-assembled device.

Micro-transfer printable elements can be constructed using foundry fabrication processes used in the art. Layers of materials can be used, including materials such as metals, oxides, nitrides and other materials used in the integrated-circuit art. Multi-LED structures 99 can have different sizes, for example, of no more than 1000 square microns, 10,000 square microns, 100,000 square microns, or 1 square mm, or larger, and can have variable aspect ratios, for example at least 1:1, 2:1, 5:1, or 10:1. Multi-LED structures 99 and multi-LED native substrate 10 can be rectangular or can have other shapes.

Native source wafers 40 and multi-LED structures 99, micro-transfer printing stamps, target substrates 70, and display or lamp substrates 82 can be made separately and at different times or in different temporal orders or locations and provided in various process states.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
B cross section line
C LED center
CS LED contact separation distance
D1 first direction
D2 second direction
E LED length
E1 first LED length
E2 second LED length
L cantilever length
L1 first cantilever length
L2 second cantilever length
LS LED emission separation distance
X1, Y1 first distance
X2, Y2 second distance
10 multi-LED native substrate
10A first multi-LED native substrate
10B second multi-LED native substrate
10M multi-LED native substrate mesa
12A first LED substrate edge
12B second LED substrate edge
14A first LED substrate corner
14B second LED substrate corner
20 LED
20A first LED
20B second LED/blue LED
20R red LED
20G green LED
22 LED tether
24 patterned dielectric layer
25 LED structure tether
26 LED contact pad
26A first LED contact pad
26B second LED contact pad
28 LED electrode
28A first LED electrode
28B second LED electrode
30 semiconductor layer
30A first semiconductor portion
30B second semiconductor portion
30P semiconductor portion
31 first layer
32 second layer
33 emission portion
33A first emission portion
33B second emission portion
34 cantilever portion
34A first cantilever portion
34B second cantilever portion
36 base portion
38 recombination zone
39 conduction zone
40 native source wafer
41 handle wafer
42 patterned sacrificial layer
44 sacrificial portion
45 adhesive layer
46 anchor
48 epitaxial layers
50 display controller/lamp controller
52 control signal
54 power/voltage signal
56 ground
60 pixel
61 red sub-pixel
62 green sub-pixel
63 blue sub-pixel
64 white sub-pixel
66 pixel controller
68 pixel array
70 target substrate
71 blue efficiency vs. current density
71M blue efficiency maximum
72 green efficiency vs. current density
72M green efficiency maximum
73 red efficiency vs. current density
73M red efficiency maximum
80 display/lamp
82 display substrate/lamp substrate
99 multi-LED structure
99A first multi-LED structure
99B second multi-LED structure/blue multi-LED structure
99G green multi-LED structure
99R red multi-LED structure
100 provide native source wafer with sacrificial portions step
100A provide native source wafer with sacrificial portions step
110 dispose multi-LED native substrate step
120 dispose semiconductor layer over sacrificial portions step
130 pattern semiconductor layer step
140 dispose electrode step
150 etch sacrificial portions step
150A etch sacrificial portions step
160 provide stamp step
170 provide target substrate step
180 micro-transfer print multi-LED structure step
200 form sacrificial portions step
210 provide handle substrate step
220 adhere handle substrate step
230 remove native source wafer step

The invention claimed is:

1. A multi-LED structure, comprising:
a multi-LED native substrate;
a patterned semiconductor layer native to the multi-LED native substrate comprising semiconductor portions disposed at least partially on or over the multi-LED native substrate, the semiconductor portions defining at least a first LED and a second LED separate from the first LED that are native to the multi-LED native substrate, the first LED and the second LED each comprising (i) a first layer having a cantilever portion and a base portion, and (ii) a second layer disposed only over the base portion of the first layer and comprising an emission portion; and an LED electrode disposed on at least a portion of the first LED and on at least a portion of the second LED, the LED electrode electrically connecting the first LED to the second LED, wherein (i) the cantilever portion of the first LED extends in a first direction and the base portion of the first LED extends in a second direction different from the first direction, (ii) the cantilever portion of the first LED has a first cantilever length, the cantilever portion of the second LED has a second cantilever length, and an LED emission separation distance between the emission portion of the first LED and the emission portion of the second LED is less than or equal to the first cantilever length and less than or equal to the second cantilever length, or (iii) both (i) and (ii).

2. The multi-LED structure of claim 1, wherein the LED electrode is disposed on at least a portion of the multi-LED native substrate or a non-semiconductor structure in the patterned semiconductor layer.

3. The multi-LED structure of claim 1, wherein the first LED and the second LED are electrically connected in serial.

4. The multi-LED structure of claim 1, wherein the first LED and the second LED are electrically connected in parallel.

5. The multi-LED structure of claim 1, wherein the first LED and the second LED have any one or combination of (i) substantially the same size, (ii) substantially the same area over the multi-LED substrate, and (iii) substantially the same light-emitting area.

6. The multi-LED structure of claim 1, comprising an LED structure tether.

7. The multi-LED structure of claim 1, wherein any one or combination of (i) the multi-LED native substrate has a surface and the first direction is orthogonal to the second direction and both the first and the second directions are substantially parallel to the surface, (ii) at least a portion of the first LED and at least a portion of the second LED extend in substantially a same direction, and (iii) at least a portion of the first LED and at least a portion of the second LED extend in substantially orthogonal directions.

8. The multi-LED structure of claim 1, wherein the semiconductor portions further define at least a third LED separate from the first LED and separate from the second LED.

9. The multi-LED structure of claim 1, comprising a first LED contact disposed on the first LED and a second LED contact disposed on the second LED, wherein the first LED contact and the second LED contact are spatially separated from the LED electrode.

10. The multi-LED structure of claim 9, wherein an LED contact separation distance between the first LED contact and the second LED contact is greater than (i) a first LED length of the first LED, (ii) a second LED length of the second LED, or (iii) the larger of the first LED length and the second LED length.

11. The multi-LED structure of claim 9, wherein the multi-LED native substrate has a center, a first edge, and a second edge different from the first edge, and the first LED contact is disposed closer to the first edge than to the center and the second LED contact is disposed closer to the second edge than to the center, or wherein the multi-LED native substrate has a center, a first corner, and a second corner different from the first corner, and the first LED contact is disposed closer to the first corner than to the center and the second LED contact is disposed closer to the second corner than to the center.

12. The multi-LED structure of claim 1, wherein the multi-LED native substrate is a first multi-LED native substrate and the multi-LED structure comprises a second multi-LED native substrate disposed on the first multi-LED structure, other LEDs separate and independent of the first and second LEDs disposed on the second multi-LED native substrate, wherein the first LED and the second LED each comprise a different semiconductor material from the other LEDs and the other LEDs are native to the second multi-LED native substrate.

13. The multi-LED structure of claim 12, comprising one or more LEDs separate from the first LED and separate from the second LED disposed on the first multi-LED native substrate, wherein the first and second LEDs comprise a different semiconductor material from the one or more LEDs and the one or more LEDs are non-native to the first multi-LED substrate.

14. The multi-LED structure of claim 1, comprising one or more LEDs separate from the first LED and separate from the second LED disposed on the multi-LED native substrate, wherein the first and second LEDs comprise a different semiconductor material from the one or more LEDs and the one or more LEDs are non-native to the multi-LED substrate.

15. The multi-LED structure of claim 1, wherein the multi-LED native substrate comprises at least a portion of the first layer or the first layer comprises at least a portion of the multi-LED native substrate and the multi-LED native substrate is electrically conductive.

16. The multi-LED structure of claim 1, wherein the first LED and the second LED comprise a common epitaxial material.

17. The multi-LED structure of claim 1, wherein the first LED and the second LED emit a same color of light.

18. The multi-LED structure of claim 1, wherein the cantilever portion of the first LED and the base portion of the first LED are disposed such that the first LED forms an L-shape.

19. A multi-LED component structure, comprising:
a component substrate; and
one or more multi-LED structures, wherein the at least one multi-LED structures comprises a first multi-LED structure disposed on the component substrate and each of the one or more multi-LED structures comprises:
a multi-LED native substrate,
a patterned semiconductor layer native to the multi-LED native substrate comprising semiconductor portions disposed at least partially on or over the multi-LED native substrate, the semiconductor portions defining at least a first LED and a second LED separate from the first LED that are native to the multi-LED native substrate, the first LED and the second LED each comprising (i) a first layer having a cantilever portion and a base portion, and (ii) a second layer disposed only over the base portion of the first layer and comprising an emission portion, and
an LED electrode disposed on at least a portion of the first LED and on at least a portion of the second LED, the LED electrode electrically connecting the first LED to the second LED,
wherein the multi-LED structure is non-native to the component substrate.

20. The multi-LED component structure of claim 19, wherein:
(i) the one or more multi-LED structures further comprises a second multi-LED structure disposed on the component substrate,
(ii) the multi-LED component structure comprises one or more other LEDs disposed on the component substrate that are non-native to the component substrate, or
(iii) both (i) and (ii).

21. The multi-LED component structure of claim 20, wherein (i) the multi-LED component structure comprises the second multi-LED structure and the first multi-LED structure and the second multi-LED structure emit different colors of light or (ii) the multi-LED component structure comprises the one or more other LEDs and the first multi-LED structure emits a different color of light from the one or more other LEDs.

22. An LED wafer, comprising a wafer comprising sacrificial portions separated by anchors, wherein each of the sacrificial portions has a multi-LED structure disposed entirely and completely over the sacrificial portion and the multi-LED structure is physically connected to an anchor of the anchors with a tether, wherein the multi-LED structure comprises
a multi-LED native substrate,
a patterned semiconductor layer native to the multi-LED native substrate comprising semiconductor portions disposed at least partially on or over the multi-LED native substrate, the semiconductor portions defining at least a first LED and a second LED separate from the first LED that are native to the multi-LED native substrate, the first LED and the second LED each comprising (i) a first layer having a cantilever portion and a base portion, and (ii) a second layer disposed only over the base portion of the first layer and comprising an emission portion, and
an LED electrode disposed on at least a portion of the first LED and on at least a portion of the second LED, the LED electrode electrically connecting the first LED to the second LED.

23. A multi-LED structure, comprising:
An electrically conductive semiconductor layer comprising a cantilever portion, two or more spatially separated base portions, and a separate emissive portion comprising a light-emissive semiconductor portion disposed on each base portion; and
an LED contact pad disposed on each emissive portion, wherein each emissive portion emits light when electrical power is provided through the cantilever portion and the LED contact pad.

* * * * *